(12) United States Patent
Chida et al.

(10) Patent No.: US 7,888,163 B2
(45) Date of Patent: Feb. 15, 2011

(54) SEMICONDUCTOR DEVICE AND METHOD FOR MANUFACTURING THE SAME

(75) Inventors: Akihiro Chida, Atsugi (JP); Takaaki Nagata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 68 days.

(21) Appl. No.: 12/473,299

(22) Filed: May 28, 2009

(65) Prior Publication Data

US 2009/0302455 A1    Dec. 10, 2009

(30) Foreign Application Priority Data

Jun. 6, 2008    (JP) .............................. 2008-149535

(51) Int. Cl.
*H01L 21/00*    (2006.01)
(52) U.S. Cl. .................... 438/82; 438/149; 438/458; 257/40; 257/E51.013
(58) Field of Classification Search ............. 438/82, 438/99, 149, 455–459; 257/40, E51.013
See application file for complete search history.

(56) References Cited

U.S. PATENT DOCUMENTS

| | | | |
|---|---|---|---|
| 5,075,166 A | 12/1991 | Sikorski et al. |
| 5,597,631 A | 1/1997 | Furumoto et al. |
| 5,757,456 A | 5/1998 | Yamazaki et al. |
| 5,770,313 A | 6/1998 | Furumoto et al. |
| 5,821,138 A | 10/1998 | Yamazaki et al. |
| 6,118,502 A | 9/2000 | Yamazaki et al. |
| 6,224,965 B1 | 5/2001 | Haas et al. |
| 6,376,333 B1 | 4/2002 | Yamazaki et al. |
| 6,403,221 B1 | 6/2002 | Nakamura et al. |
| 6,491,228 B1 | 12/2002 | Ueda et al. |
| 6,762,508 B1 | 7/2004 | Kiso et al. |
| 6,998,282 B1 | 2/2006 | Yamazaki et al. |
| 7,049,178 B2 | 5/2006 | Kim et al. |

(Continued)

FOREIGN PATENT DOCUMENTS

EP    0939441    9/1999

(Continued)

OTHER PUBLICATIONS

'Search Report (Application No. 09161307.5) Dated Aug. 28, 2009.

*Primary Examiner*—Brook Kebede
(74) *Attorney, Agent, or Firm*—Eric J. Robinson; Robinson Intellectual Property Law Office, P.C.

(57) ABSTRACT

An object is to increase resistance against an electrostatic breakdown and to increase resistance to an external stress. Another object is to reduce cost by simplifying the manufacturing process. In a step in which an element formation layer is provided between a first organic resin layer provided with a first conductive film on its surface and a second organic resin layer provided with a second conductive film on its surface to electrically connect the first conductive film and the second conductive film with a contact conductor formed in each of the organic resin layers, the contact conductor provided in each of the first organic resin layer and the second organic resin layer is manufactured by making paste penetrate before an organic resin is cured and then curing the organic resin layer.

14 Claims, 21 Drawing Sheets

U.S. PATENT DOCUMENTS

| | | |
|---|---|---|
| 7,050,138 B1 | 5/2006 | Yamazaki et al. |
| 7,061,083 B1 | 6/2006 | Usami et al. |
| 7,361,519 B2 | 4/2008 | Yamazaki et al. |
| 7,485,489 B2 | 2/2009 | Björbell |
| 7,487,373 B2 | 2/2009 | Koyama |
| 2003/0032210 A1 | 2/2003 | Takayama et al. |
| 2003/0038280 A1 | 2/2003 | Kojo et al. |
| 2003/0071953 A1 | 4/2003 | Yamazaki et al. |
| 2004/0016939 A1 | 1/2004 | Akiba et al. |
| 2004/0229404 A1 | 11/2004 | Kiso et al. |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2005/0233122 A1 | 10/2005 | Nishimura et al. |
| 2006/0011288 A1 | 1/2006 | Watanabe et al. |
| 2006/0117554 A1 | 6/2006 | Herrmann et al. |
| 2007/0004125 A1 | 1/2007 | Watanabe et al. |
| 2007/0023758 A1 | 2/2007 | Tsurume et al. |
| 2007/0030205 A1 | 2/2007 | Farrell et al. |
| 2007/0030681 A1 | 2/2007 | Farrell et al. |
| 2007/0044303 A1 | 3/2007 | Yamano |
| 2007/0181875 A1 | 8/2007 | Yamazaki et al. |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0044940 A1 | 2/2008 | Watanabe et al. |
| 2008/0093464 A1 | 4/2008 | Dairiki et al. |
| 2008/0186185 A1 | 8/2008 | Herrmann et al. |
| 2008/0224941 A1* | 9/2008 | Sugiyama et al. ........... 343/873 |
| 2008/0242005 A1* | 10/2008 | Dozen et al. ................ 438/127 |
| 2008/0303140 A1 | 12/2008 | Ohtani et al. |

FOREIGN PATENT DOCUMENTS

| | | |
|---|---|---|
| EP | 1092739 | 4/2001 |
| EP | 1589797 | 10/2005 |
| EP | 1758438 | 2/2007 |
| EP | 1818860 A | 8/2007 |
| EP | 1970951 | 9/2008 |
| JP | 05-190582 | 7/1993 |
| JP | 06-350250 A | 12/1994 |
| JP | 08-250745 | 9/1996 |
| JP | 08-288522 | 11/1996 |
| JP | 10-092980 | 4/1998 |
| JP | 10-302027 | 11/1998 |
| JP | 2000-231619 | 8/2000 |
| JP | 2001-277726 | 10/2001 |
| JP | 2003-174153 | 6/2003 |
| JP | 2004-118255 | 4/2004 |
| JP | 2004-362341 | 12/2004 |
| JP | 2006-139802 | 6/2006 |
| JP | 2007-241999 | 9/2007 |
| WO | WO-96/009158 | 3/1996 |
| WO | WO 01/01740 | 1/2001 |
| WO | WO 2004/001848 | 12/2003 |
| WO | WO-2007/016433 | 2/2007 |

* cited by examiner

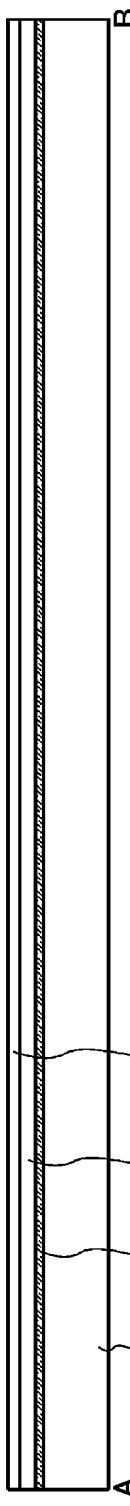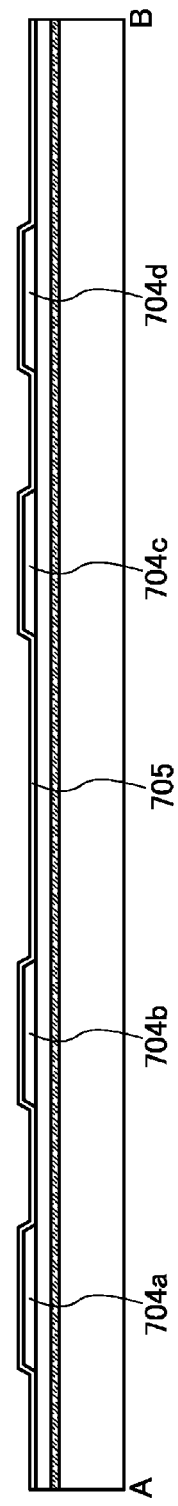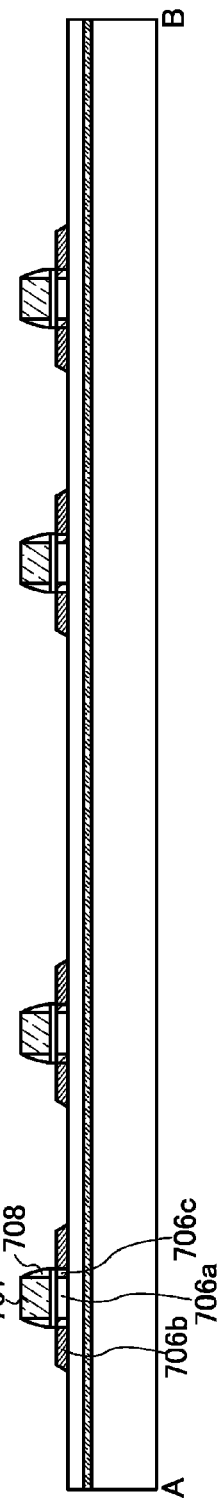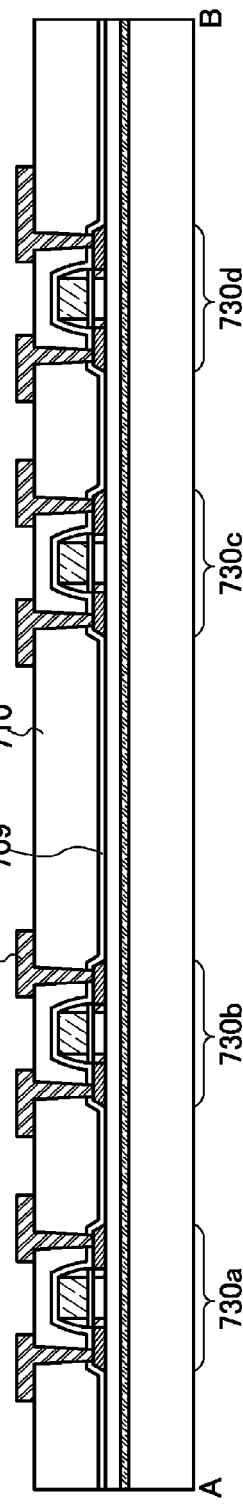

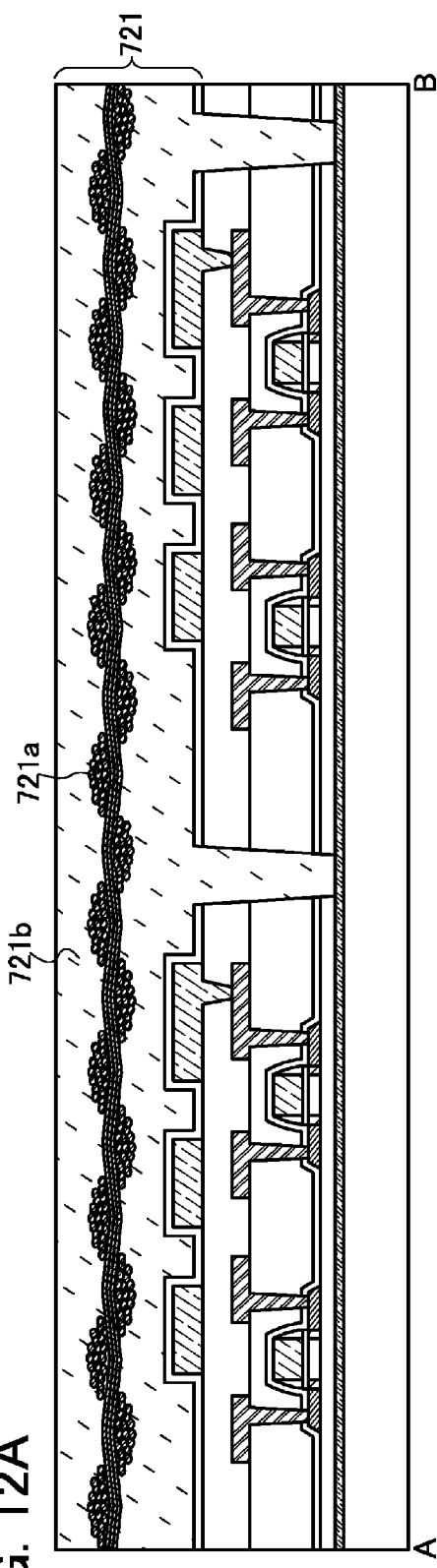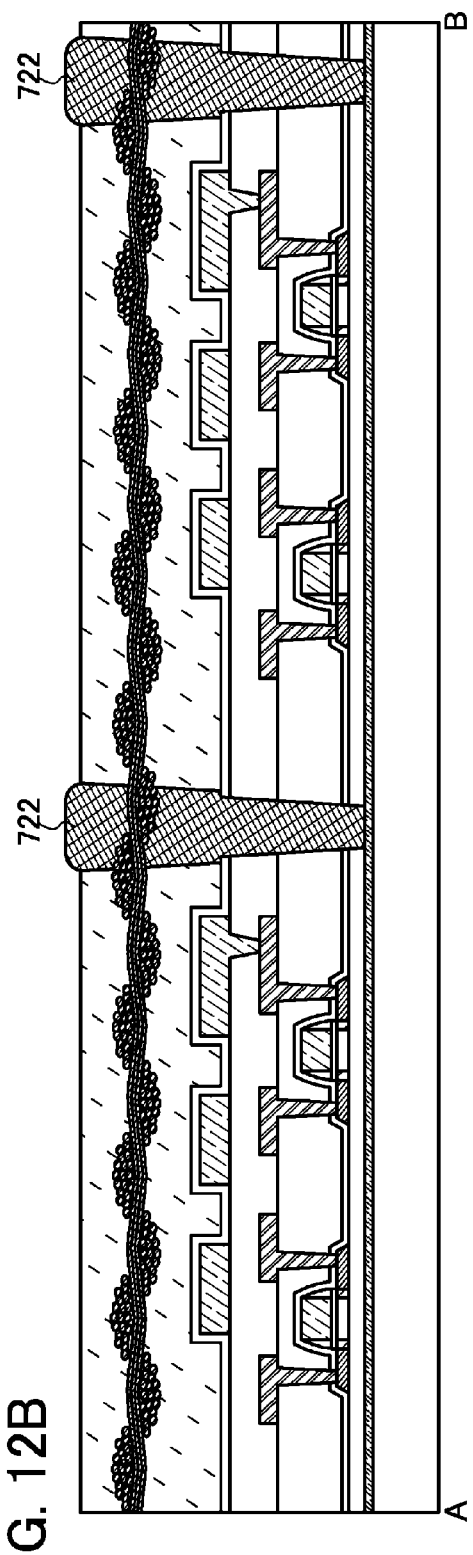
FIG. 12A
FIG. 12B

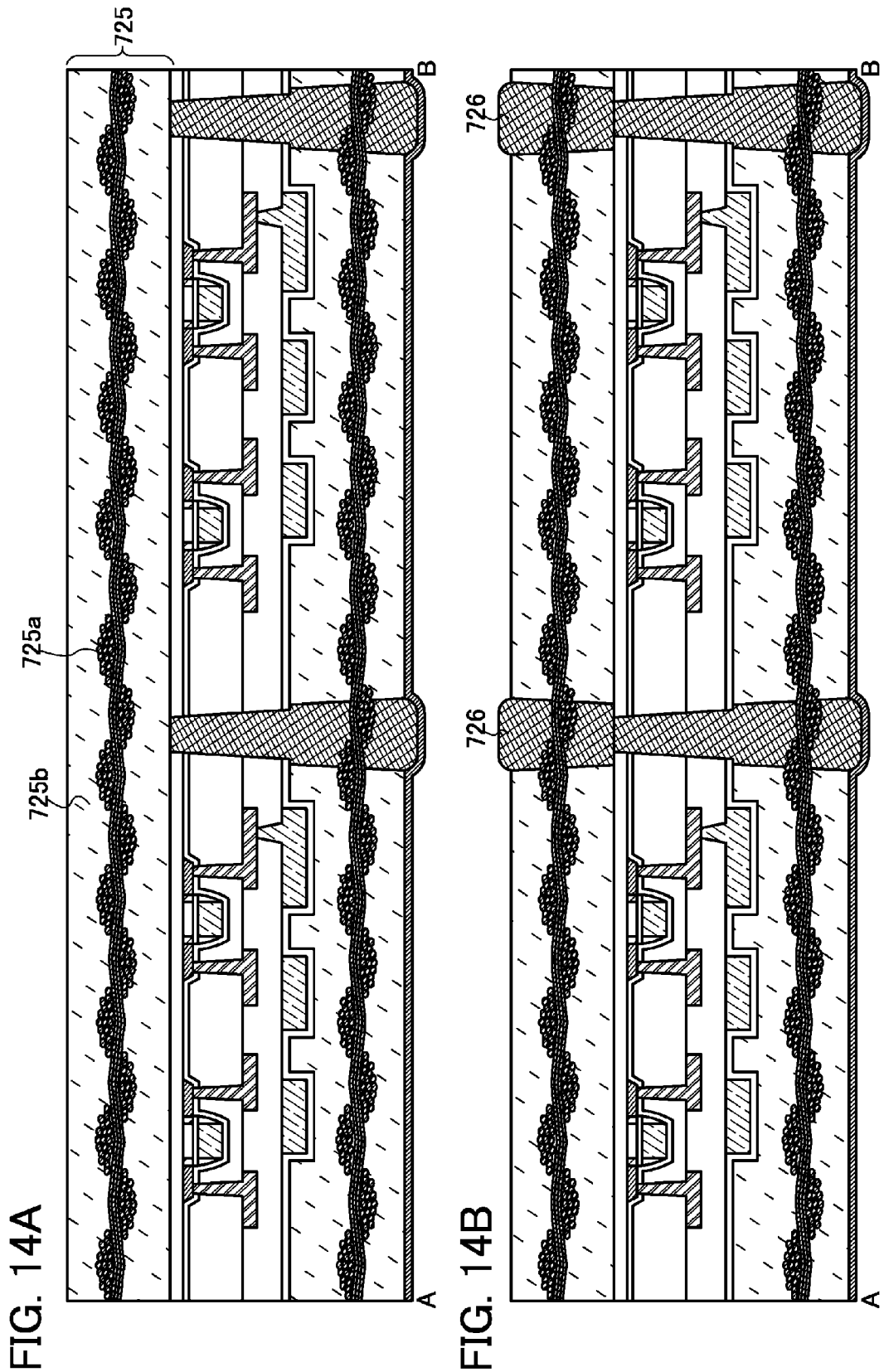

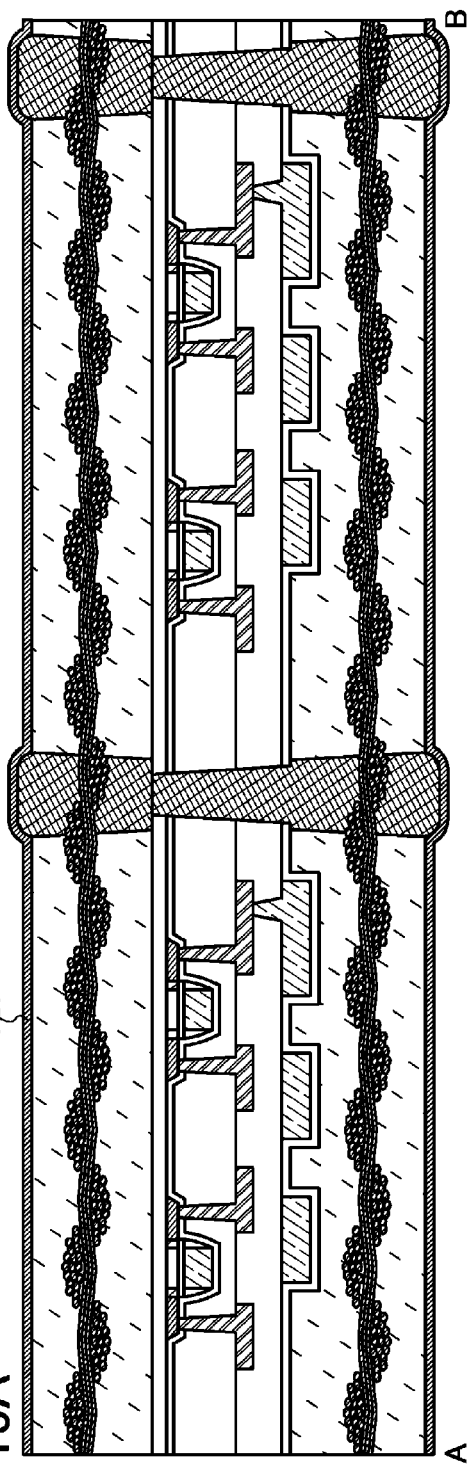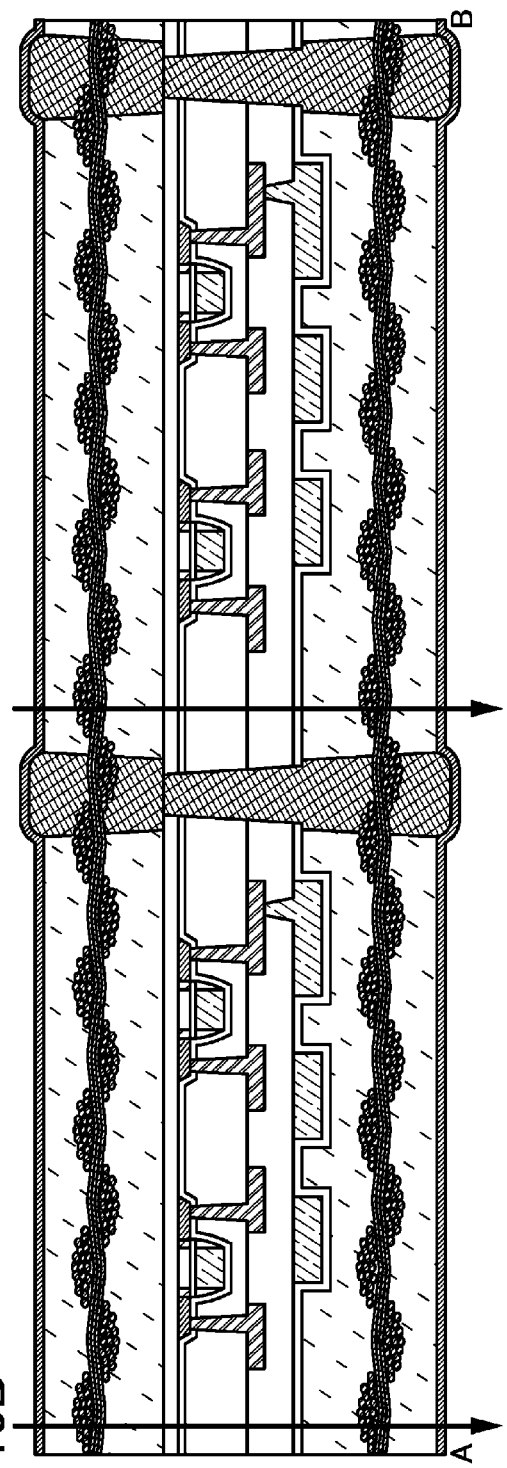

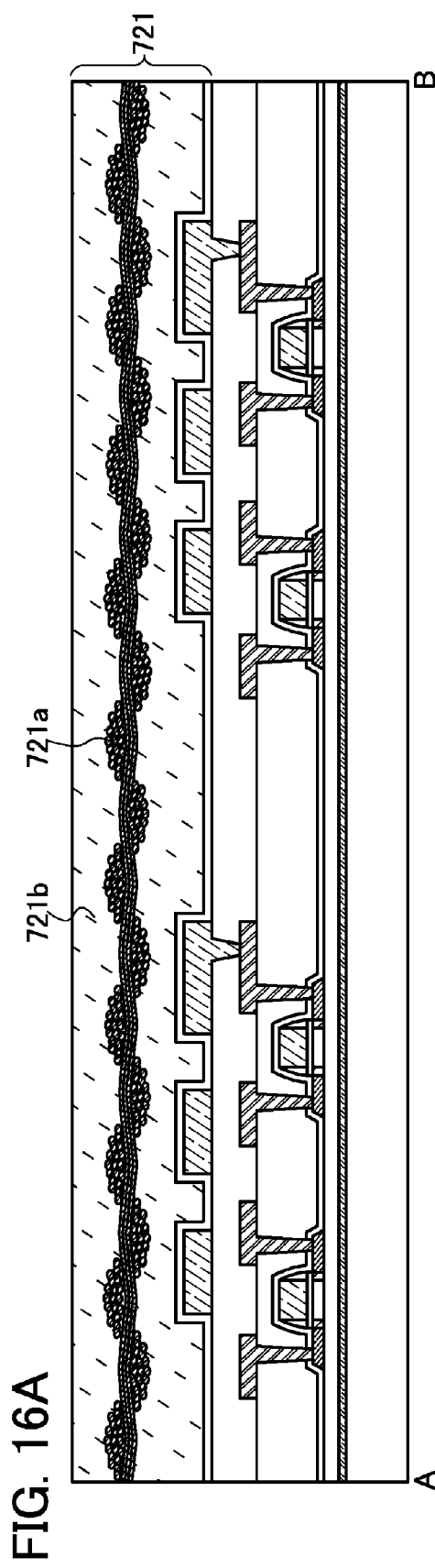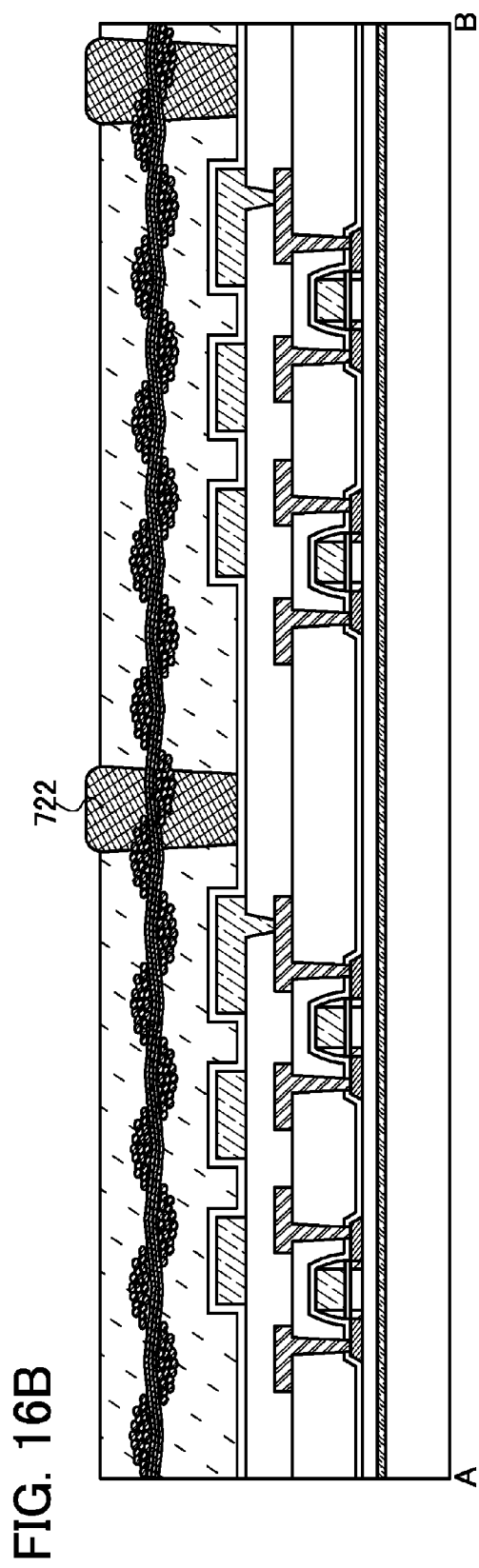

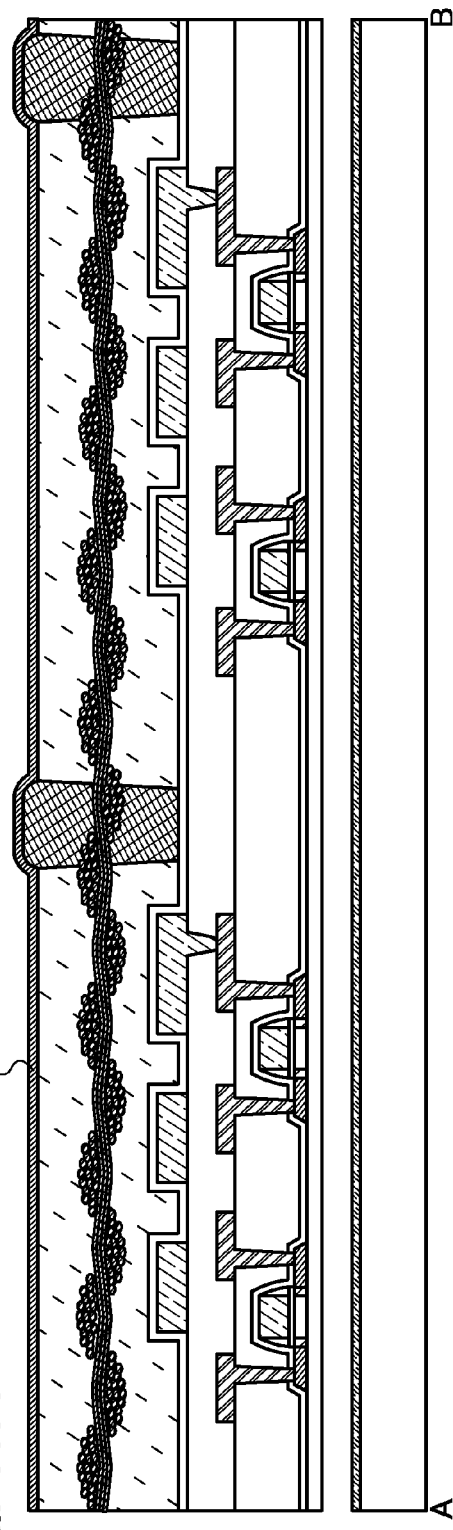
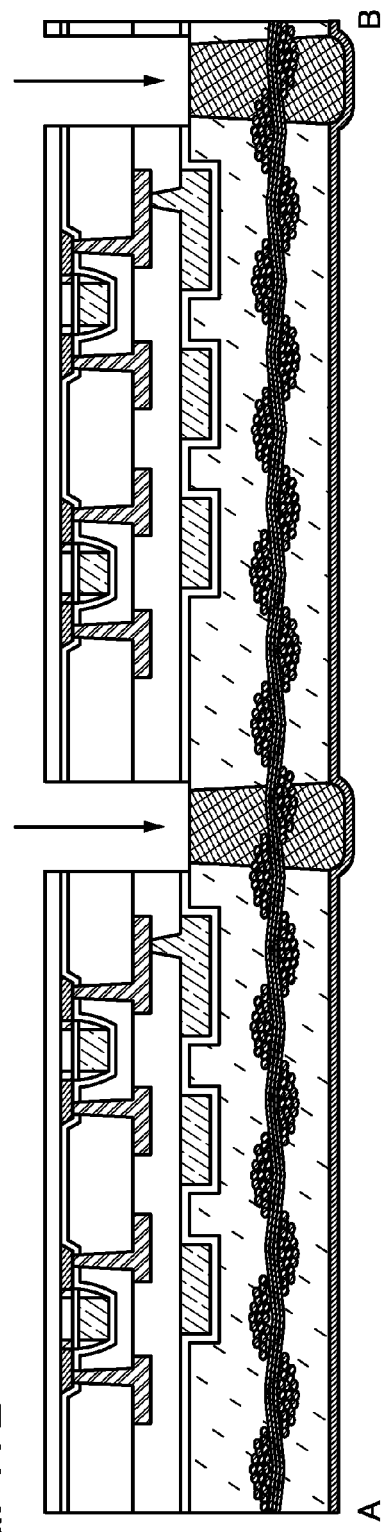
FIG. 17A
FIG. 17B

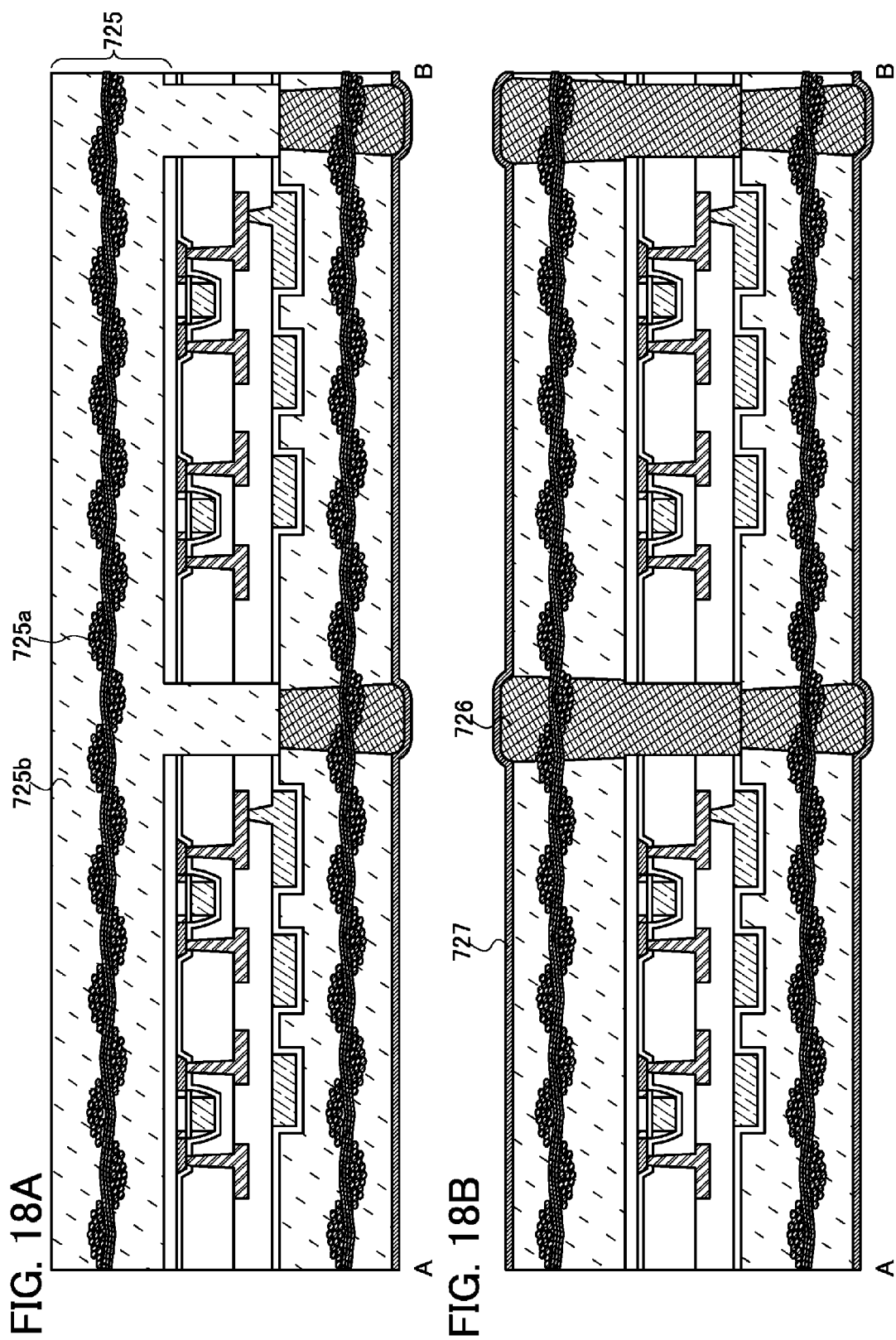

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device. In particular, the present invention relates to a semiconductor device which transmits and receives a signal to/from outside without contact and a method for manufacturing the semiconductor device.

2. Description of the Related Art

As for a semiconductor device which transmits and receives a signal by wireless communication through an antenna (a non-contact signal processing device or a semiconductor integrated circuit chip), a breakdown of a semiconductor device which is caused by electrostatic discharge (an electrostatic breakdown) is a serious problem which leads to reduction in reliability or in productivity in a period from the time when a manufacturing process of a semiconductor device is carried out to the time when the semiconductor device is inspected and used as a product. Thus, it is important to take measures against the problem.

As a measure against the electrostatic breakdown, for example, use of a conductive polymer layer for a substrate or an adhesive in the semiconductor device has been proposed (for example, Patent Document 1).

In addition to taking measures against an electrostatic breakdown, reduction in size and in thickness is needed for a semiconductor device, and such a semiconductor device is expected to have improved resistance to external stress.

[Citation List]
[Patent Document 1] Japanese Published Patent Application No. 2007-241999

SUMMARY OF THE INVENTION

With the expansion of the market for semiconductor devices, there arise a variety of needs for the shape and characteristics expected of semiconductor devices. Further, from the assumption that semiconductor devices are used in various situations due to the expansion of the market, semiconductor devices with high resistance against an electrostatic breakdown and against an external stress are needed.

It is an object of one embodiment of the present invention to increase resistance against an electrostatic breakdown and to increase resistance to an external stress. It is another object of the present invention to reduce cost by simplifying the manufacturing process.

One embodiment of the present invention is that, in a step in which an element formation layer is provided between a first organic resin layer provided with a first conductive film on its surface and a second organic resin layer provided with a second conductive film on its surface to electrically connect the first conductive film and the second conductive film with a conductor formed in each of the organic resin layers, the conductor provided in each of the first organic resin layer and the second organic resin layer is manufactured by making paste penetrate before an organic resin is cured and then curing the organic resin layer.

One embodiment of the present invention includes: forming a separation layer over a substrate; over the separation layer, forming an element formation layer having a semiconductor integrated circuit and an antenna; forming a first organic resin layer so as to cover the element formation layer; over a first surface of the first organic resin layer, before the first organic resin layer is cured, forming first paste with conductivity in a region not overlapping with at least the element formation layer; after the first paste is made to penetrate into the first organic resin layer, forming a first conductor which reaches a second surface of the first organic resin layer opposite to the first surface of the first organic resin layer from the first surface by curing the first organic resin layer; forming a first conductive film over the first organic resin layer so as to be electrically connected to the first conductor and so as to overlap with the element formation layer; separating the element formation layer from the substrate to expose the first conductor formed in the first organic resin layer on the separation surface; forming a second organic resin layer over the separation surface; over a first surface of the second organic resin layer, before the second organic resin layer is cured, forming second paste with conductivity in a region overlapping with at least the first conductor exposed on the separation surface; after the second paste is made to penetrate into the second organic resin layer, forming a second conductor which reaches a second surface of the second organic resin layer opposite to the first surface of the second organic resin layer from the first surface and is electrically connected to the first conductor by curing the second organic resin layer; and forming a second conductive film over the second organic resin layer so as to be electrically connected to the second conductor and so as to overlap with the element formation layer.

Another embodiment of the present invention includes: forming a separation layer over a substrate; forming a first protective film over the separation layer; over the first protective film, forming an element formation layer having a semiconductor integrated circuit and an antenna; forming a second protective film over the element formation layer; forming a first organic resin layer so as to cover the second protective film; before the first organic resin layer is cured, forming first paste with conductivity in a meshed manner over a first surface of the first organic resin layer; after the first paste is made to penetrate into the first organic resin layer, forming a first conductor which reaches a second surface of the first organic resin layer opposite to the first surface of the first organic resin layer from the first surface by curing the first organic resin layer; separating the element formation layer from the substrate and selectively removing the first protective film and the second protective film at the separation surface to expose the first conductor formed in the first organic resin layer; forming a second organic resin layer over the separation surface; before the second organic resin layer is cured, forming second paste with conductivity in a meshed manner over a first surface of the second organic resin layer; and forming a second conductor which reaches a second surface of the second organic resin layer opposite to the first surface of the second organic resin layer from the first surface and is electrically connected to the first conductor by curing the second organic resin layer after the second paste is made to penetrate into the second organic resin layer.

Another embodiment of the present invention includes: a first organic resin layer and a second organic resin layer which are provided so as to face each other; an element formation layer having a semiconductor integrated circuit and an antenna which is provided between the first organic resin layer and the second organic resin layer; a first conductive film provided on a first surface of the first organic resin layer; a second conductive film provided on a first surface of the second organic resin layer; a first conductor which is electrically connected to the first conductive film and reaches a second surface of the first organic resin layer opposite to the first surface of the first organic resin layer from the first surface; and a second conductor which is electrically connected to the second conductive film and reaches a second surface of the second organic resin layer opposite to the first surface of the second organic resin layer from the first surface, where the first organic resin layer includes at least a structure body in which a fibrous body is impregnated with an organic resin, the first conductor is provided in the first organic resin layer through space in the fibrous body without breaking the fibrous body, and the first conductive film and the second conductive film are electrically connected to each other through the first conductor and the second conductor.

Note that a semiconductor device in this specification refers to a device that can operate by utilizing semiconductor characteristics. By using the present invention, a device that has a circuit including a semiconductor element (such as a transistor, a memory element, or a diode), and a semiconductor device such as a chip having a processor circuit can be manufactured.

According to one embodiment of the present invention, by electrically connecting a conductive film provided on a first organic resin layer to a conductive film provided on a second organic resin layer which interpose an element formation layer, through a contact conductor provided in each of the first organic resin layer and the second organic resin layer, resistance against an electrostatic breakdown can be increased. Further, a conductor can be provided in an organic resin layer without a through-hole in the organic resin layer; therefore, resistance against external stress can be increased.

According to one embodiment of the present invention, even in the case where an element formation layer is interposed between a first organic resin layer and a second organic resin layer and a conductive film formed in the first organic resin layer and a conductive film formed in the second organic resin layer are electrically connected to each other through a conductor provided in each of the first organic resin layer and the second organic resin layer, a step of providing a through-hole in the first organic resin layer and the second organic resin layer can be omitted; therefore, the manufacturing process can be simplified.

BRIEF DESCRIPTION OF THE DRAWINGS

FIGS. 10A to 10D are diagrams illustrating an example of a method for manufacturing a semiconductor device.

FIGS. 12A and 12B are diagrams illustrating an example of a method for manufacturing a semiconductor device.

FIGS. 14A and 14B are diagrams illustrating an example of a method for manufacturing a semiconductor device.

FIGS. 15A and 15B are diagrams illustrating an example of a method for manufacturing a semiconductor device.

FIGS. 16A and 16B are diagrams illustrating an example of a method for manufacturing a semiconductor device.

FIGS. 17A and 17B are diagrams illustrating an example of a method for manufacturing a semiconductor device.

FIGS. 18A and 18B are diagrams illustrating an example of a method for manufacturing a semiconductor device.

DETAILED DESCRIPTION OF THE INVENTION

Figure 1A:
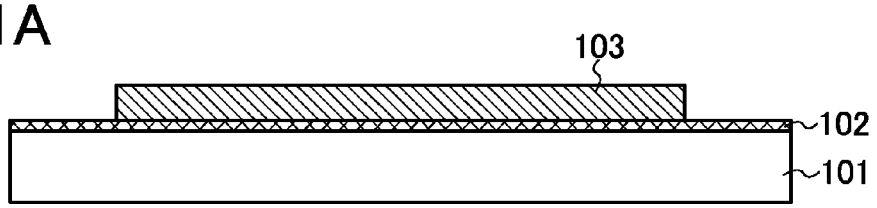
FIGS. 1A to 1E are diagrams illustrating an example of a method for manufacturing a semiconductor device.

Embodiments of the present invention will hereinafter be described with reference to drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiments described below. Note that, in the structure of the present invention to be described below, identical portions or portions having similar functions are marked by same reference numerals throughout the drawings so as to eliminate repeated explanation.

Embodiment 1

In this embodiment, an example of a method for manufacturing a semiconductor device and a semiconductor device manufactured by the manufacturing method is described with reference to drawings.

First, an element formation layer 103 having a semiconductor integrated circuit and an antenna is formed over a substrate 101 with a separation layer 102 interposed therebetween (see FIG. 1A).

As the substrate 101, a glass substrate, a quartz substrate, a sapphire substrate, a ceramic substrate, a metal substrate having an insulating layer over its surface, or the like can be used. Furthermore, a plastic substrate which can withstand the processing temperature of this embodiment may be used as the substrate 101.

The separation layer 102 is a film which is used at the time of separating the element formation layer 103 from the substrate 101 in a later step, and for example, the separation layer is formed by a sputtering method, a plasma CVD method, a coating method, a printing method, or the like, using a single layer or stacked layers of a layer formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir) and silicon (Si); or an alloy material or a chemical compound material containing any of the elements as its main component. A crystalline structure of a layer containing silicon may be any of an amorphous structure, a microcrystalline structure, or a polycrystalline structure. Note that a coating method includes a spin-coating method, a droplet discharge method, and a dispensing method in its category here.

Note that there is no need to provide the separation layer 102 as long as the element formation layer 103 can be separated from the substrate 101 in a later step.

The element formation layer 103 is provided with the semiconductor integrated circuit including a transistor, a capacitor, and the like. Further, the shape or the length of the antenna provided in the element formation layer 103 may be selected depending on a frequency used or the like. Further, a conductive film formed over a semiconductor integrated circuit may be used as an antenna, and in this case, the antenna provided over the semiconductor integrated circuit is also referred to as an on-chip antenna.

Figure 1B:
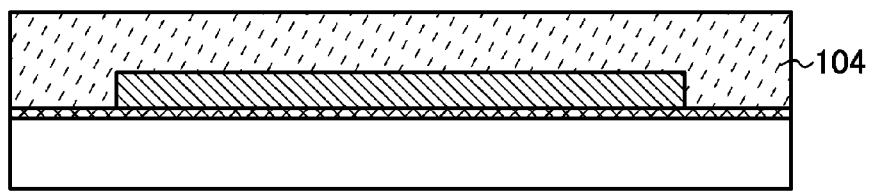

Next, a first organic resin layer 104 is formed so as to cover the element formation layer 103 (see FIG. 1B).

The first organic resin layer 104 can be formed using a thermosetting resin such as an epoxy resin, an unsaturated polyester resin, a polyimide resin, a bismaleimide-triazine resin, or a cyanate resin. Further, the first organic resin layer 104 may be formed using a thermoplastic resin such as a polyphenylene oxide resin, a polyetherimide resin, or a fluorine resin. The first organic resin layer 104 functions as a support body at the time of separating the element formation layer 103 from the substrate 101, and also functions as a protective layer which suppresses breaking of the element formation layer 103 which is caused by application of external stress.

Figure 1C:
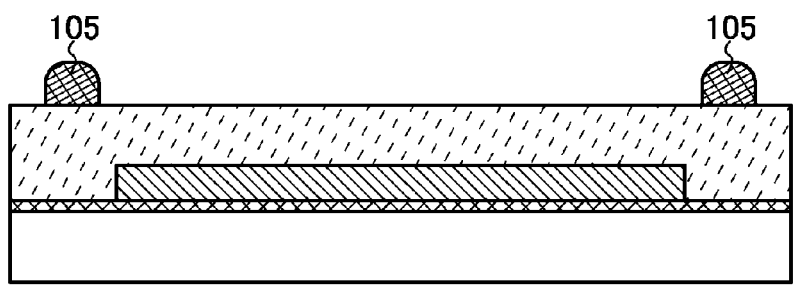
Figure 1D:
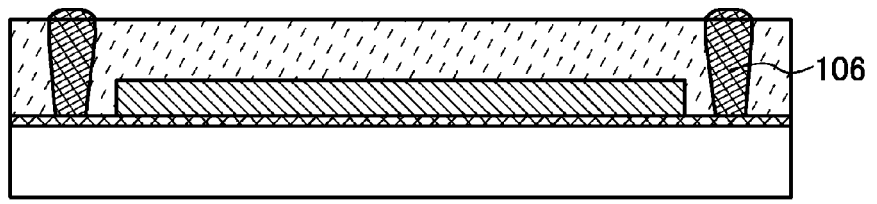

Next, before the first organic resin layer 104 is cured, paste 105 with conductivity is selectively formed over a surface (a first surface) of the first organic resin layer 104 (see FIG. 1C), and at least part of the paste 105 is made to penetrate into the first organic resin layer 104 (the first organic resin layer 104 is impregnated with at least part of the paste 105). Then, the first organic resin layer 104 is cured (see FIG. 1D). As a result, a first conductor 106 can be provided in the first organic resin layer 104.

Note that over the surface of the first organic resin layer 104, the paste 105 is formed in a region not overlapping with the element formation layer 103, and is made to penetrate to a lower surface (a second surface, that is, a surface opposite to the first surface) of the first organic resin layer. Thus, the first conductor 106 reaches the second surface of the first organic resin layer 104 from the first surface thereof (the first conductor 106 is provided to be continuous). Further, the first conductor 106 functions as a contact conductor.

The paste 105 with conductivity can be selectively formed over the first organic resin layer 104 by a droplet discharge method or a printing method such as a screen printing method. In this embodiment, the paste 105 is formed so as to avoid the element formation layer 103. However, in the case where a protective film or the like is provided over the element formation layer 103, the paste 105 may be formed directly above the element formation layer 103 (for example, over an entire surface of the first organic resin layer 104). Note that the paste 105 may be provided at one site or multiple sites.

As the paste 105 with conductivity, conductive paste including at least a conductive particle, an organic resin which dissolves or disperses the conductive particle, and a solvent which dissolves the first organic resin layer 104 prior to curing, can be used. By including the solvent which dissolves the first organic resin layer 104 prior to curing in the paste 105, the first organic resin layer 104 can be effectively impregnated with the paste 105.

As the conductive particle, a fine particle or a dispersive nanoparticle of metal of one or more of silver (Ag), gold (Au), copper (Cu), nickel (Ni), platinum (Pt), palladium (Pd), tantalum (Ta), molybdenum (Mo), titanium (Ti), or the like or silver halide can be used.

In addition, as the organic resin included in the paste 105, one or more selected from organic resins functioning as a binder, a solvent, a dispersive agent, and a coating member of the metal particle can be used.

As the solvent which dissolves the first organic resin layer 104 prior to curing, esters such as butyl acetate, alcohols such as isopropyl alcohol, or an organic solvent such as acetone may be selected as appropriate in consideration of a material for the first organic resin layer 104.

Further, after the paste 105 is made to penetrate into the first organic resin layer 104, the paste is preferably cured by baking before curing of the first organic resin layer 104, at the same time as curing of the first organic resin layer 104, or after curing of the first organic resin layer 104.

As an example, in the case where an epoxy resin, which is a thermosetting resin, is used as the first organic resin layer 104, silver paste (silver powder, 2-(2-butoxyethoxy)ethyl acetate, and an epoxy resin) can be used as the paste 105. In this case, by forming the paste 105 over the first organic resin layer 104 before curing of the first organic resin layer 104 (in a temporarily cured resin), the first organic resin layer 104 prior to curing is dissolved by 2-(2-butoxyethoxy)ethyl acetate included in the paste 105, so that the paste 105 can be made to penetrate into the first organic resin layer 104. After that, heat treatment is performed, whereby the first organic resin layer 104 is cured and silver included in the paste 105 is cured. Thus, the conductor 106 including silver can be provided in the first organic resin layer 104.

As described above, in the case where a thermosetting resin is used as the first organic resin layer 104, curing of the first organic resin layer 104 and baking of the paste 105 can be concurrently performed by heat treatment. Therefore, a process can be simplified. Note that at the time of performing heat treatment, pressure may be applied.

Figure 1E:
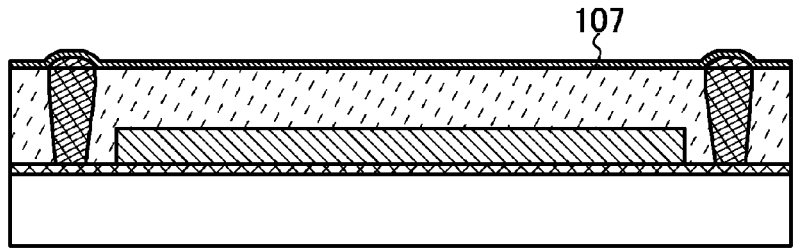

Next, a first conductive film 107 is formed over the first surface of the first organic resin layer 104 (see FIG. 1E). The first conductive film 107 is provided so as to be electrically connected to the first conductor 106.

For example, the first conductive film 107 may be formed using an element selected from titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a chemical compound material, a nitride material, or an oxide material which contains any of the above elements as a main component by a sputtering method, a plasma CVD method, a coating method, a printing method, or the like.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

By providing the first conductive film 107, static electricity applied by electrostatic discharge can be diffused and removed or electric charges can be prevented from locally existing (from being localized) (that is, a potential difference can be prevented from locally existing in a semiconductor device). Therefore, an electrostatic breakdown of a semiconductor integrated circuit included in the element formation layer 103 can be suppressed.

Therefore, the first conductive film 107 may be provided at least in a region overlapping with the element formation layer 103. As an example, as shown in FIG. 1E, a structure can be employed in which the first conductive film 107 is provided over an entire surface of the first organic resin layer 104. In the case where the first conductive film 107 is provided over the entire surface, a large region can be protected from static electricity.

The semiconductor device described in this embodiment is operated by induced electromotive force generated by an electromagnetic wave from outside (the semiconductor device has a function of wireless transmission). Therefore, the first conductive film 107 needs to prevent a breakdown of the semiconductor integrated circuit which is caused by static electricity and to be formed using a conductive material which transmits an electromagnetic wave.

It is generally known that an electromagnetic wave is attenuated in a substance. In particular, an electromagnetic wave is highly attenuated in a conductive material. Therefore, the thickness of the first conductive film 107 is made small enough to transmit an electromagnetic wave. The thickness of the first conductive film 107 may be set on the basis of the frequency of an electromagnetic wave used for communication, or the resistivity or magnetic permeability of a conductive material used for the first conductive film 107.

In the case where a frequency of an electromagnetic wave of 13.56 MHz is used and titanium (resistivity ρ: $5.5 \times 10^{-7}$ (Ω·m)) is used for the first conductive film 107 as an example, the thickness is set to at most about 500 nm or less. By this, a breakdown of a semiconductor device which is caused by electrostatic discharge can be suppressed and communication with outside can be favorably performed.

In the case where indium tin oxide containing silicon oxide (also referred to as ITSO) with resistivity higher than titanium is used, the first conductive film 107 may be formed to a thickness of at most about 700 nm or less.

Further, the lower limit of the thickness of the first conductive film 107 is preferably determined on the basis of the resistivity. In the case where a conductive material used for the first conductive film 107 has high resistivity, in order to effectively diffuse static electricity, the first conductive film 107 is preferably formed thick.

In order to effectively prevent a breakdown of a semiconductor device which is caused by static electricity, the thickness of the first conductive film 107 is preferably determined so that the sheet resistance of the first conductive film 107 is set to be smaller than or equal to $1.0 \times 10^7$ Ω/square, preferably smaller than or equal to $1.0 \times 10^4$ Ω/square, more preferably smaller than or equal to $1.0 \times 10^2$ Ω/square.

That is, it is preferable that the resistivity of the first conductive film 107 be reduced in terms of suppression of an electrostatic breakdown, while it is preferable that the thickness of the first conductive film 107 be small in terms of transmission of an electromagnetic wave. Therefore, the thickness of the first conductive film 107 is preferably as small as possible if the sheet resistance of the first conductive film 107 is in the above range.

Note that in the case where titanium or the like with low resistivity is used for a conductive material, the sheet resistance can be made low enough and an electromagnetic wave can be easily transmitted even if the thickness is extremely small. However, in consideration of the manufacturing process and the like, the thickness of the first conductive film 107 may be at least 1 nm or more (preferably, 3 nm or more).

Alternatively, in the case where indium tin oxide or the like with comparatively high resistivity is used, the thickness of the first conductive film 107 is preferably at least 5 nm or more.

As described above, by controlling a material and a thickness of the first conductive film 107 in terms of suppression of an electrostatic breakdown and in terms of transmission of an electromagnetic wave, a breakdown of a semiconductor device which is caused by electrostatic discharge can be effectively suppressed, and a semiconductor device which can favorably communicate with outside can be obtained.

Figure 2A:
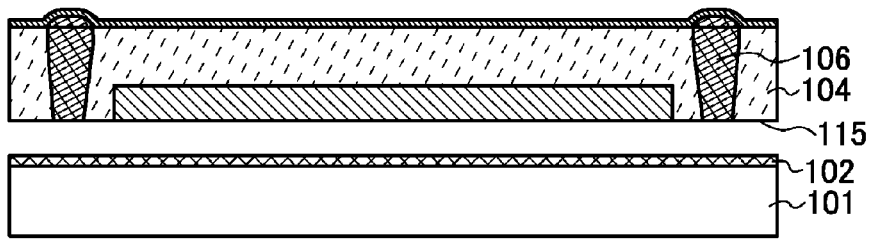
FIGS. 2A to 2E are diagrams illustrating an example of a method for manufacturing a semiconductor device.

Next, the element formation layer 103 and the first organic resin layer 104 are separated from the substrate 101 by using the separation layer 102 (see FIG. 2A). As a result, the element formation layer 103 is provided on the first organic resin layer 104 side. Further, by a separation step, on a surface at which separation occurs (hereinafter, referred to as a "separation surface 115"), the first conductor 106 reaching the second surface of the first organic resin layer 104 (here, the separation surface 115) is exposed. Note that in the case where the first conductor 106 does not reach the second surface or the case where the first conductor 106 is not exposed due to the remaining separation layer 102 on the separation surface 115, or the like, the first conductor 106 may be exposed by etching, polishing, or laser beam irradiation from the separation surface 115 side.

Figure 2B:
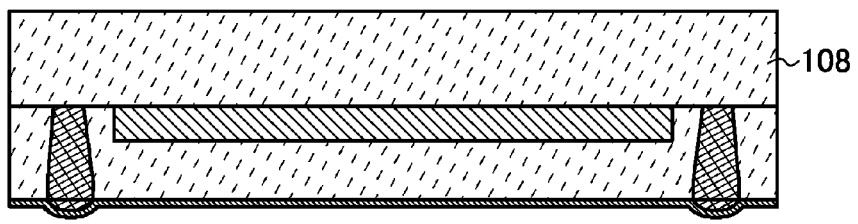

Next, a second organic resin layer 108 is formed so as to be in contact with the separation surface 115 (see FIG. 2B).

The second organic resin layer 108 may be formed using a thermosetting resin such as an epoxy resin, an unsaturated polyester resin, a polyimide resin, a bismaleimide-triazine resin, or a cyanate resin. Further, the second organic resin layer 108 may be formed using a thermoplastic resin such as a polyphenylene oxide resin, a polyetherimide resin, or a fluorine resin. Further, the first organic resin layer 104 and the second organic resin layer 108 may be formed using the same material.

Figure 2C:
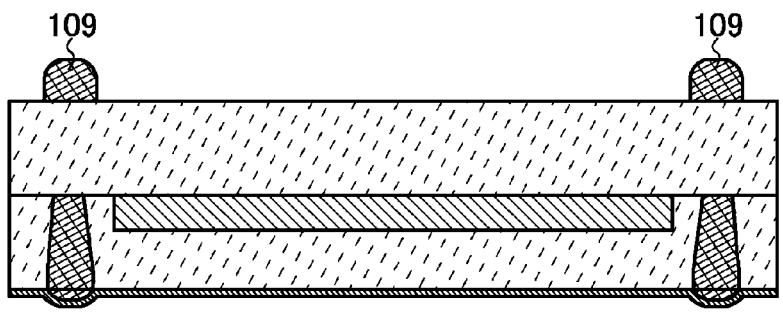
Figure 2D:
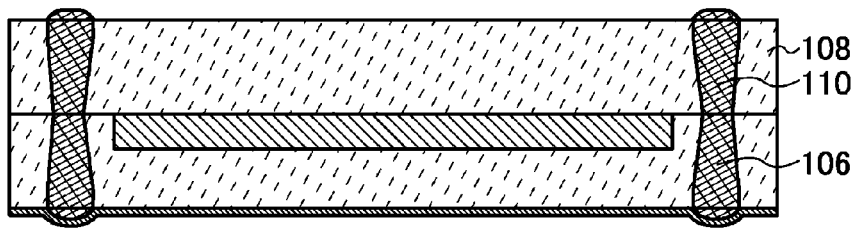

Next, before the second organic resin layer 108 is cured, paste 109 with conductivity is selectively formed over a surface (a first surface) of the second organic resin layer 108 (see FIG. 2C). After at least part of the paste 109 is made to penetrate into the second organic resin layer 108, the second organic resin layer 108 is cured (see FIG. 2D). As a result, a second conductor 110 can be provided in the second organic resin layer 108.

Further, the paste 109 is formed in a region overlapping with the first conductor 106 exposed on the separation surface 115 and is made to penetrate to a second surface of the second organic resin layer 108 (a surface in contact with the first organic resin layer 104). Thus, the second conductor 110 reaches the second surface of the second organic resin layer 108 from the first surface thereof (the second conductor 110 is provided to be continuous), and is electrically connected to the first conductor 106. Further, the second conductor 110 functions as a contact conductor.

In this embodiment, the paste 109 is formed so as to avoid the element formation layer 103. However, in the case where a protective film or the like is provided over the element formation layer 103, the paste 109 may be formed directly above the element formation layer 103 (for example, over an entire surface of the second organic resin layer 108).

As a material or a manufacturing method of the paste 109, any of the materials or manufacturing methods of the paste 105 which are exemplified above can be used. Of course, the paste 109 may be formed using the same material as the paste 105.

Figure 2E:
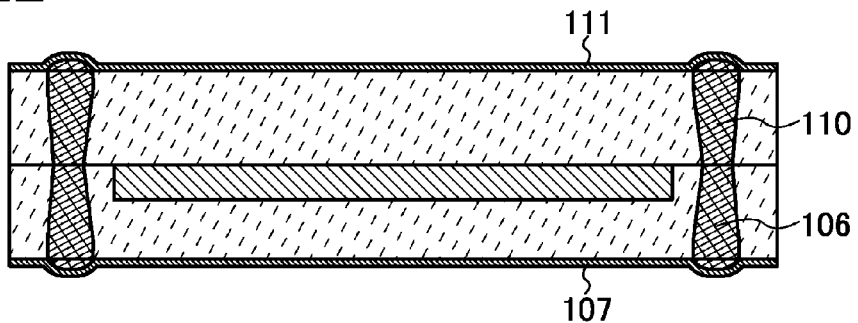

Next, a second conductive film 111 is formed over the first surface of the second organic resin layer 108 (see FIG. 2E). The second conductive film 111 is provided so as to be electrically connected to the second conductor 110. As a result, the first conductive film 107 and the second conductive film 111 are provided to be electrically connected to each other through the first conductor 106 and the second conductor 110.

As a material or a manufacturing method of the second conductive film 111, any of the materials or manufacturing methods of the first conductive film 107 which are exemplified above can be used. Of course, the second conductive film 111 may be formed using the same material as the first conductive film 107.

By providing the second conductive film 111, static electricity applied by electrostatic discharge can be diffused and removed or electric charges can be prevented from locally existing (from being localized) (that is, a potential difference can be prevented from locally existing in a semiconductor device). Therefore, an electrostatic breakdown of a semiconductor integrated circuit included in the element formation layer 103 can be suppressed.

Therefore, the second conductive film 111 may be provided at least in a region overlapping with the element formation layer 103. As an example, as shown in FIG. 2E, a structure can be employed in which the second conductive film 111 is provided over an entire surface of the second organic resin layer 108. In the case where the second conductive film 111 is provided over the entire surface, a large region can be protected from static electricity.

In particular, the first conductive film 107 provided over the first organic resin layer 104 and the second conductive film 111 provided over the second organic resin layer 108 are electrically connected to each other to be equipotential, whereby static electricity can be effectively diffused and electric charges can be effectively prevented from being localized as compared to the case where the first conductive film 107 and the second conductive film 111 are provided so as not to be electrically connected to each other or the case where only one of the first organic resin layer 104 and the second organic resin layer 108 is provided with a conductive film. As a result, an electrostatic breakdown of a semiconductor integrated circuit can be effectively suppressed.

Further, the thickness of the second conductive film 111 is also made small enough to transmit an electromagnetic wave as with the first conductive film.

Through the above-described steps, a semiconductor device is obtained. By using the manufacturing method described in this embodiment, even in the case where electrical connection is formed through the first organic resin layer 104 and the second organic resin layer 108, an etching step for forming a through-hole in each of the first organic resin layer 104 and the second organic resin layer 108 becomes unnecessary. Therefore, the manufacturing process can be simplified.

Further, in this embodiment, the first conductive film 107 and the second conductive film 111 are electrically connected to each other with the first conductor 106 provided in the first organic resin layer 104 and the second conductor 110 provided in the second organic resin layer 108. Therefore, even if a side surface or an end portion of a semiconductor device is selectively worn by friction or the like, poor electrical connection between the first conductive film 107 and the second conductive film 111 can be suppressed.

Further, by making the paste 105 penetrate into the first organic resin layer 104 before the first organic resin layer 104 is cured and then curing the first organic resin layer 104, a step of providing a through-hole in the first organic resin layer 104 becomes unnecessary. As a result, even in the case where the first conductive film 107 and the second conductive film 111 are electrically connected to each other with the first conductor 106 provided in the first organic resin layer 104 and the second conductor 110 provided in the second organic resin layer 108, occurrence of a crack or the like in the first organic resin layer 104 and the second organic resin layer 108 can be suppressed. In addition, the manufacturing process can be simplified.

Note that, in this embodiment, the case where the element formation layer 103 is provided over the substrate 101 with the separation layer 102 interposed therebetween is described. However, instead of the separation step, polishing of the substrate 101 may be performed to remove the substrate 101. In this case, the element formation layer 103 is provided over the substrate 101 without the separation layer 102, and then, the substrate 101 may be selectively removed.

This embodiment can be implemented by being combined with the structure or the manufacturing method which are described in any of other embodiments in this specification, as appropriate.

Embodiment 2

In this embodiment, the case where the structure described in Embodiment 1 employs structure bodies in each of which a fibrous body is impregnated with an organic resin is used instead of being impregnated with the first organic resin layer and the second organic resin layer is described with reference to drawings.

First, a structure of a structure body is described with reference to FIG. 3A.

Figure 3A:
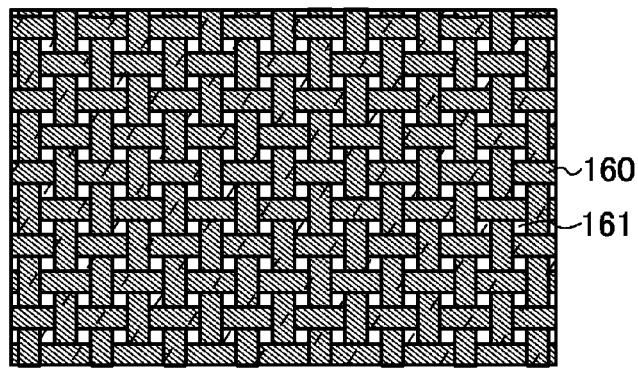
FIGS. 3A to 3D are diagrams illustrating an example of a method for manufacturing a semiconductor device.

The structure body can have a structure in which a fibrous body 160 which is woven using warp yarns spaced at regular intervals and weft yarns spaced at regular intervals is impregnated with an organic resin 161 (see FIG. 3A). In the structure body shown in FIG. 3A, part of the fibrous body 160 does not include the warp yarns and the weft yarns. The organic resin 161 can be formed in the region.

The fibrous body 160 is a woven fabric or a nonwoven fabric using high-strength fibers of an organic compound or an inorganic compound and is provided so that fibers therein partly overlap. The high-strength fibers are specifically fibers with a high modulus of elasticity in tension or a fiber with a high Young's modulus. As typical examples of high-strength fibers, polyvinyl alcohol fibers, polyester fibers, polyamide fibers, polyethylene fibers, aramid fibers, polyparaphenylene benzobisoxazole fibers, glass fibers, carbon fibers, and the like can be given. As the glass fibers, glass fibers using E glass, S glass, D glass, Q glass, or the like can be used. Note that the fibrous body 160 may be formed using one kind of the above-described high-strength fibers or a plurality of the above-described high-strength fibers.

The fibrous body 160 may be formed using a woven fabric which is woven using bundles of fibers (single yarns) (hereinafter, referred to as yarn bundles) for warp yarns and weft yarns, or a nonwoven fabric obtained by stacking yarn bundles of fibers of plural kinds in a random manner or in one direction. In the case of a woven fabric, a plain-woven fabric, a twilled fabric, a satin-woven fabric, or the like can be used as appropriate.

The yarn bundle may have a circular shape or an elliptical shape in its cross section. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. In a yarn bundle of fibers which is subjected to fabric opening, the width is increased and the number of single yarns in the thickness direction is reduced, and thus, such a yarn bundle has an elliptical shape or a flat shape in its cross section. Further, by using a loosely twisted yarn as the yarn bundle of fibers, the yarn bundle is easily flattened, and thus, such a yarn bundle has an elliptical shape or a flat shape in its cross section. Use of a yarn bundle having an elliptical shape or a flat shape in its cross section in this manner can make the thickness of the fibrous body 160 small. Accordingly, a thin semiconductor device can be manufactured.

As the organic resin 161, a thermosetting resin such as an epoxy resin, an unsaturated polyester resin, a polyimide resin, a bismaleimide-triazine resin, or a cyanate resin can be used. Further, a thermoplastic resin such as a polyphenylene oxide resin, a polyetherimide resin, or a fluorine resin can be used. When the above-described organic resin is used, the fibrous body can be fixed to a semiconductor integrated circuit by heat treatment. The higher the glass transition temperature of the organic resin 161 is, the harder the organic resin 161 is broken by local pressure, which is preferable.

Highly thermally-conductive filler may be dispersed in the organic resin 161 or in the yarn bundle of fibers. As the highly thermally-conductive filler, aluminum nitride, boron nitride, silicon nitride, alumina, or the like can be given. As the highly thermally-conductive filler, metal particles of silver, copper, or the like can also be given. When the conductive filler is included in the organic resin or in the yarn bundle of fibers, heat generated in a semiconductor integrated circuit can be easily released to the outside. Accordingly, thermal storage of the semiconductor device can be suppressed, and a breakdown of the semiconductor device can be suppressed.

The structure body in which the fibrous body 160 is impregnated with the organic resin 161 is also referred to as a prepreg. A prepreg is specifically formed in a following manner: after a fibrous body is impregnated with a varnish in which a matrix resin is diluted with an organic solvent, drying is performed, so that the organic solvent is volatilized and the matrix resin is semi-cured.

In the case of using a structure body in which a fibrous body is impregnated with an organic resin instead of the first organic resin layer and the second organic resin layer in the above embodiment, the thickness of the structure body is preferably greater than or equal to 10 μm and less than or equal to 100 μm, more preferably greater than or equal to 10 μm and less than or equal to 30 μm. When a structure body with such a thickness is used, a thin semiconductor device capable of being curved can be manufactured. For example, a structure body with a modulus of elasticity of greater than or equal to 13 GPs and less than or equal to 15 GPa and a modulus of rupture of 140 MPa can be used.

Next, the case where a structure body in which a fibrous body is impregnated with an organic resin is used instead of being impregnated with the first organic resin layer and the second organic resin layer is described with reference to FIGS. 3B to 3D.

Figure 3B:
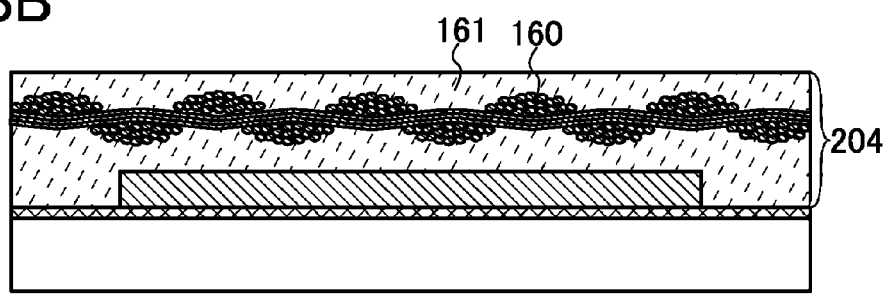
Figure 3C:
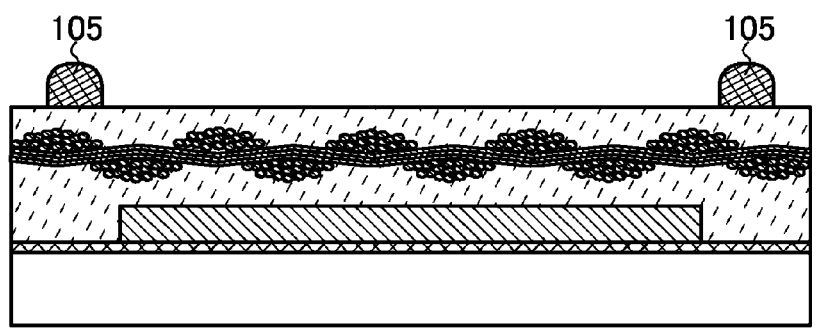
Figure 3D:
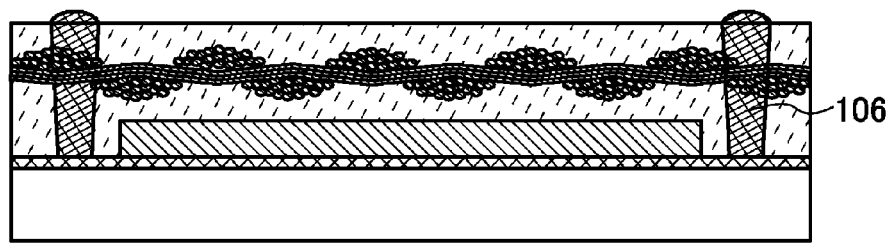

First, an element formation layer 103 having a semiconductor integrated circuit and an antenna is formed over a substrate 101 with a separation layer 102 interposed therebetween, and a first structure body 204 is formed so as to cover the element formation layer 103 (see FIG. 3B).

As the first structure body 204, a structure body in which the fibrous body 160 is impregnated with the organic resin 161 can be used.

Next, before the organic resin 161 with which the fibrous body 160 is impregnated is cured, paste 105 with conductivity is selectively formed over a surface (a first surface) of the first structure body 204 (see FIG. 3C) and at least part of the paste 105 is made to penetrate into the first structure body 204. Then, the organic resin 161 in the first structure body 204 is cured (see FIG. 3D).

In a state prior to curing of the organic resin 161, the paste 105 passes through space in the fibrous body 160 and penetrates into the organic resin 161. That is, according to this embodiment, the organic resin 161 is cured by heat treatment after the paste 105 is made to penetrate, whereby a first conductor 106 reaching a second surface of the first structure body 204 from the first surface thereof can be provided without a through-hole in the fibrous body 160 (without breaking the fibrous body 160). As a result, though the first conductor 106 is provided in the first structure body 204, the strength of the first structure body 204 can be kept.

After that, instead of the second organic resin layer 108, a second structure body in which a fibrous body is impregnated with an organic resin is used, and steps similar to that illustrated in FIG. 1E and FIGS. 2A to 2E are carried out. Thus, a structure in which the element formation layer 103 is protected by the structure body in which a fibrous body is impregnated with an organic resin can be obtained. Note that the second structure body can also be formed using a structure body in which a fibrous body is impregnated with an organic resin.

As described above, a structure body in which a fibrous body is impregnated with an organic resin is provided so as to cover the element formation layer 103, whereby pressure is dispersed in the fibrous body even when a local load (point pressure, linear pressure, or the like) is applied to a semiconductor device. Therefore, a breakdown of a semiconductor device which occurs in a mounting step or which is caused by a curvature/a bend can be suppressed. Further, by using this embodiment, the first conductor 106 and the second conductor 110 can be provided without breaking (dividing) the fibrous body 160. Therefore, the first conductive film 107 and the second conductive film 111 can be electrically connected to each other while the strength of the first structure body and the second structure body is kept.

Further, in the case where a through-hole is provided in the structure body in which a fibrous body is impregnated with an organic resin, in general, the organic resin and the fibrous body need to be removed. However, in this embodiment, it is not necessary to provide a through-hole by etching or the like. Therefore, the manufacturing process can be simplified.

This embodiment can be implemented by being combined with the structure or the manufacturing method which are described in any of other embodiments in this specification, as appropriate.

Embodiment 3

In this embodiment, an example of a method for manufacturing a semiconductor device which is different from the method described in any of the foregoing embodiments and a structure of a semiconductor device obtained by the method is described with reference to drawings. In specific, the case where the first conductive film and the second conductive film over the first organic resin layer and the second organic resin layer are formed using conductive paste is described.

Figure 4A:
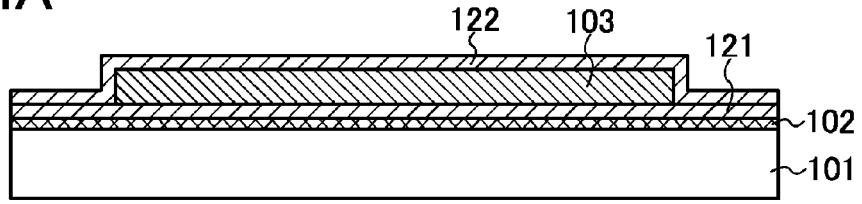
FIGS. 4A to 4E are diagrams illustrating an example of a method for manufacturing a semiconductor device.

First, an element formation layer 103 having a semiconductor integrated circuit and an antenna is formed over a substrate 101 with a separation layer 102 and a first protective film 121 interposed therebetween; then, a second protective film 122 is formed so as to cover the element formation layer 103 (see FIG. 4A).

The first protective film 121 and the second protective film 122 can be formed using an insulating layer having an inorganic material. For example, silicon oxide, silicon oxynitride, silicon nitride, silicon nitride oxide, or the like can be used for the first protective film 121 and the second protective film 122.

Note that in this specification, oxynitride refers to a substance that contains more oxygen atoms than nitrogen atoms and nitride oxide refers to a substance that contains more nitrogen atoms than oxygen atoms. For example, a "silicon oxynitride film" means a film that contains more oxygen atoms than nitrogen atoms, and oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively, when they are measured by RBS and HFS. Note that percentages of nitrogen, oxygen, silicon, and hydrogen fall within the ranges given above, where the total number of atoms contained in the silicon oxynitride or the silicon nitride oxide is defined as 100 at. %.

Figure 4B:
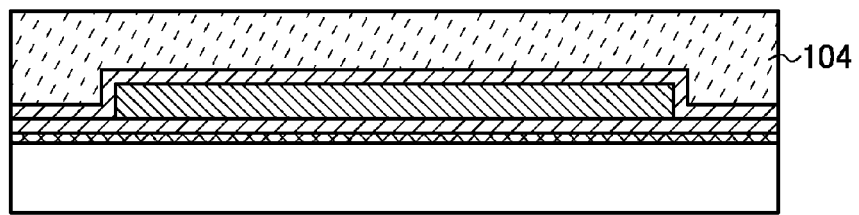

Next, a first organic resin layer 104 is formed so as to cover the second protective film 122 (see FIG. 4B).

Instead of the first organic resin layer 104, the first structure body in which a fibrous body is impregnated with an organic resin may be used as in Embodiment 2.

Figure 4C:
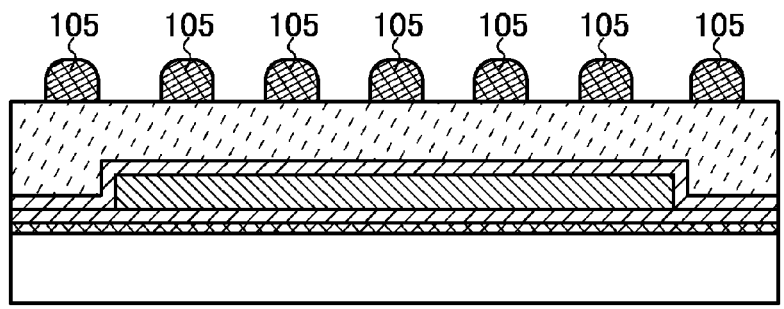
Figure 4D:
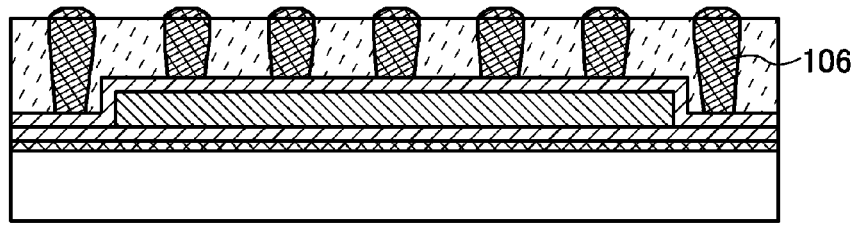

Next, before the first organic resin layer 104 is cured, paste 105 with conductivity is selectively formed over a surface (a first surface) of the first organic resin layer 104 (see FIG. 4C) and at least part of the paste 105 is made to penetrate into the first organic resin layer 104. Then, the first organic resin layer 104 is cured (see FIG. 4D). As a result, a first conductor 106 can be provided in the first organic resin layer 104.

In this embodiment, over the surface of the first organic resin layer 104, the paste 105 is formed in a region not overlapping with the element formation layer 103 and also in a region overlapping with the element formation layer 103, and is made to penetrate to a lower surface (a second surface, that is, a surface opposite to the first surface) of the first organic resin layer 104. Thus, the first conductor 106 is provided to be continuous from the first surface of the first organic resin layer 104 to the second surface thereof.

Figure 6A:
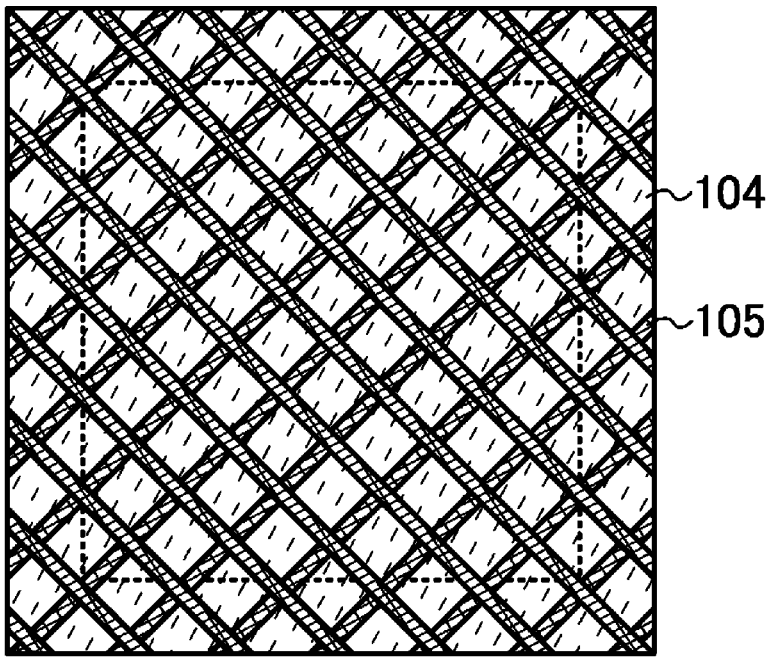
FIGS. 6A and 6B are diagrams illustrating an example of a method for manufacturing a semiconductor device.

For example, the paste 105 can be formed in a meshed manner over the first organic resin layer 104 (see FIG. 6A). In this case, the paste 105 also penetrates into the first organic resin layer 104 over the element formation layer 103. However, by providing the second protective film 122, the paste 105 can be prevented from penetrating into the element formation layer 103.

In this embodiment, the first conductor 106 provided over and in the first organic resin layer 104 in a meshed manner functions as a contact conductor and also functions as a conductor which diffuses and removes static electricity applied by electrostatic discharge or prevents electric charges from locally existing (from being localized). Further, by providing the first conductor 106 in a meshed manner, an electromagnetic wave can be sufficiently transmitted even in the case where the first conductor 106 is formed thick.

Figure 4E:
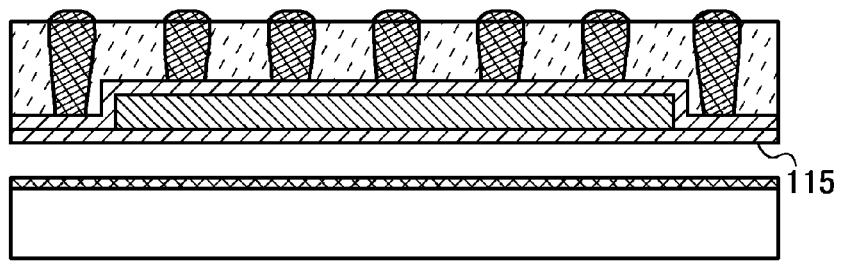

Next, the element formation layer 103 is separated from the substrate 101 by using the separation layer 102 (see FIG. 4E). As a result, the element formation layer 103 is provided on the first organic resin layer 104 side.

Figure 5A:
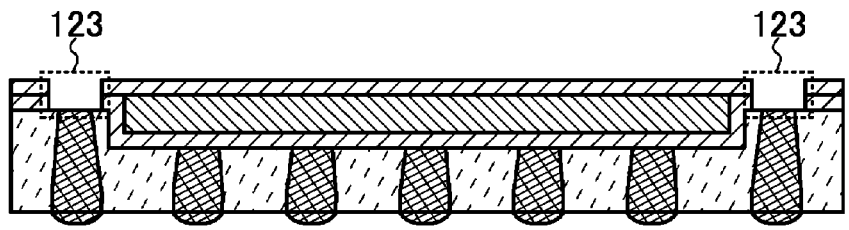
FIGS. 5A to 5D are diagrams illustrating an example of a method for manufacturing a semiconductor device.

Next, laser beam irradiation is performed from the separation surface 115 side to selectively remove the first protective film 121 and the second protective film 122. Thus, openings 123 which expose the first conductor 106 provided in the first organic resin layer 104 are formed (see FIG. 5A). Note that instead of selectively removing the first protective film 121 and the second protective film 122 with the use of a laser beam, etching or polishing may be performed to form the openings 123 which expose the first conductor 106.

Figure 5B:
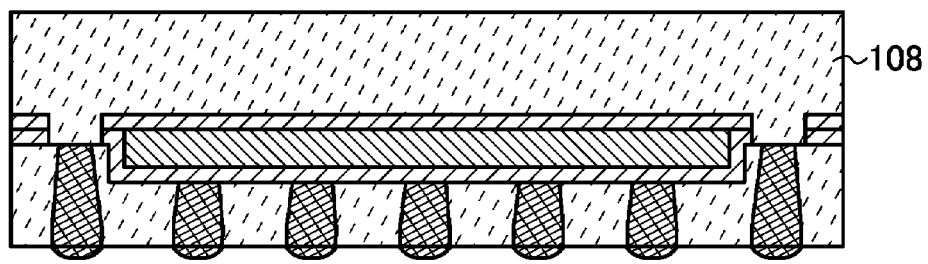

Next, a second organic resin layer 108 is formed on the separation surface 115 side (see FIG. 5B).

Instead of the second organic resin layer 108, a second structure body in which a fibrous body is impregnated with an organic resin may be used as in Embodiment 2.

Figure 5C:
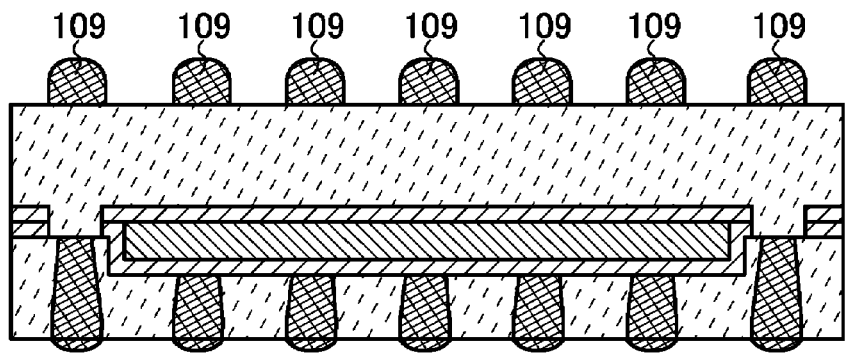
Figure 5D:
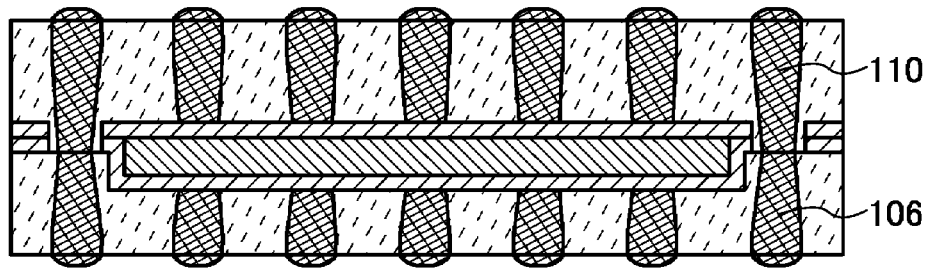

Next, before the second organic resin layer 108 is cured, paste 109 with conductivity is selectively formed over a surface (a first surface) of the second organic resin layer 108 (see FIG. 5C) and at least part of the paste 109 is made to penetrate into the second organic resin layer 108. Then, the second organic resin layer 108 is cured (see FIG. 5D). As a result, a second conductor 110 can be provided in the second organic resin layer 108.

In this embodiment, the paste 109 is formed in a region overlapping with the first conductor 106 exposed on the separation surface 115 and also in a region overlapping with the element formation layer 103, and is made to penetrate to a lower surface (a second surface, that is, a surface opposite to the first surface) of the second organic resin layer 108. Therefore, the second conductor 110 reaches the second surface of the second organic resin layer 108 from the first surface thereof, and is electrically connected to the first conductor 106 in a region not overlapping with the element formation layer 103.

Figure 6B:
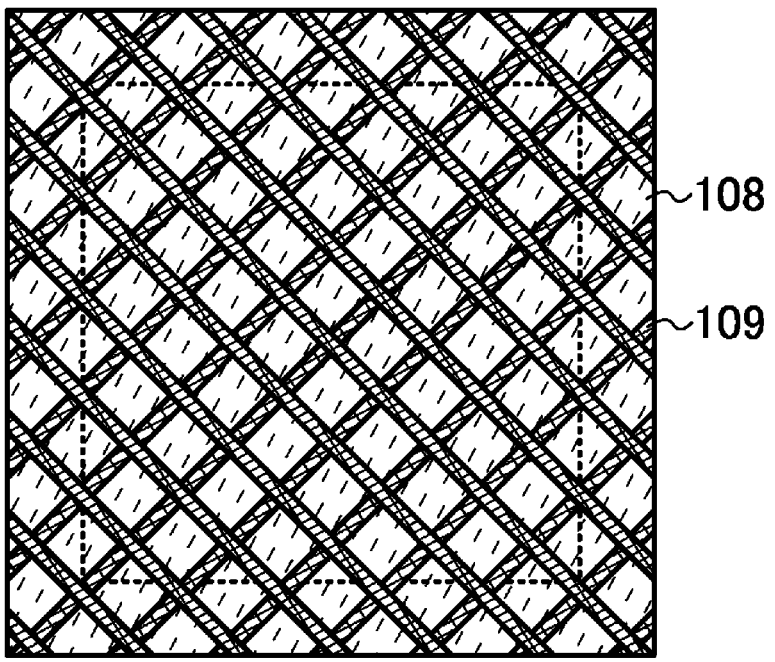

For example, the paste 109 can be formed in a meshed manner over the second organic resin layer 108 (see FIG. 6B). In this case, the paste 109 is also made to penetrate into the second organic resin layer 108 over the element formation layer 103. However, by providing the second protective film 121, the paste 109 can be prevented from penetrating into the element formation layer 103.

The second conductor 110 functions as a contact conductor, and also functions as a film which diffuses and removes static electricity applied by electrostatic discharge and which prevents electric charges from being localized.

Through the above-described steps, a semiconductor device is obtained. Use of a manufacturing method described in this embodiment makes it possible to omit a step of providing a conductive film over each of the surfaces of the first organic resin layer 104 and the second organic resin layer 108 after the first organic resin layer 104 and the second organic resin layer 108 are cured; therefore, the manufacturing process can be simplified.

Note that the case of providing the paste 105 and the paste 109 in a meshed manner is described above. However, the shape of the paste 105 and the paste 109 is not limited thereto. For example, the paste 105 and the paste 109 may be formed over an entire surface of the first organic resin layer 104 and an entire surface of the second organic resin layer 108, respectively.

Further, the amount of the paste 105 and the paste 109 which are formed may be controlled in accordance with region of the first organic resin layer 104 and the second organic resin layer 108. This case is described with reference to FIGS. 7A to 7E.

First, an element formation layer 103 having a semiconductor integrated circuit and an antenna is formed over a substrate 101 with a separation layer 102 interposed therebetween, and a first organic resin layer 104 is formed so as to cover the element formation layer 103. Subsequently, before the first organic resin layer 104 is cured, paste 105 with conductivity is formed over a surface (a first surface) of the first organic resin layer 104 (see FIG. 7A).

Here, over the surface of the first organic resin layer 104, the paste 105 is formed in an entire surface of a region 119 overlapping with the element formation layer 103 and in a region 118 not overlapping with the element formation layer 103. Further, the amount of the paste 105 per unit area which is formed in the region 119 overlapping with the element formation layer 103 is made smaller than the amount of the paste 105 per unit area which is formed in the region 118 not overlapping with the element formation layer 103. That is, in the region 118 not overlapping with the element formation layer 103, the paste 105 is made to penetrate to a lower surface (a second surface) of the first organic resin layer 104, and in the region 119 overlapping with the element formation layer 103, the paste 105 is not made to penetrate to the lower surface (the second surface) of the first organic resin layer 104.

Figure 7A:
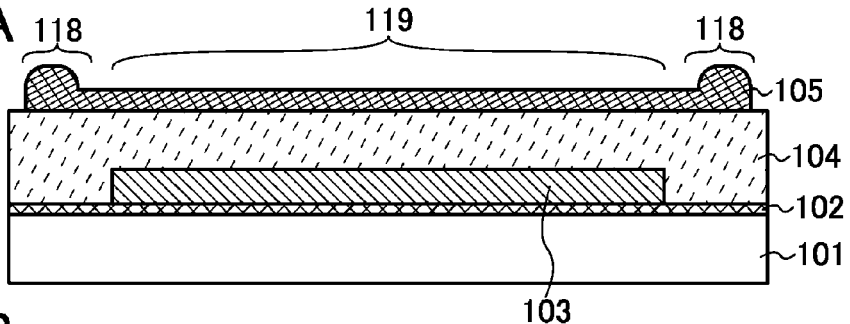
FIGS. 7A to 7E are diagrams illustrating an example of a method for manufacturing a semiconductor device.
Figure 7B:
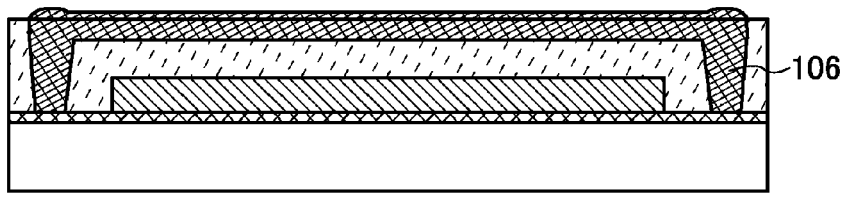

As a result, in the region 118 not overlapping with the element formation layer 103, the first conductor 106 reaches the second surface of the first organic resin layer 104 from the first surface thereof, and, in the region 119 overlapping with the element formation layer 103, the first conductor 106 is provided on the surface (the first surface) side of the first organic resin layer 104 (see FIG. 7B).

Figure 7C:
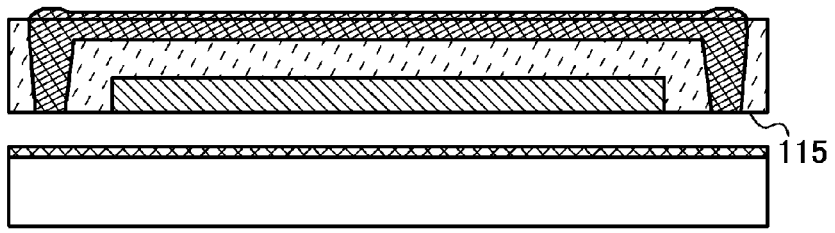
Figure 7D:
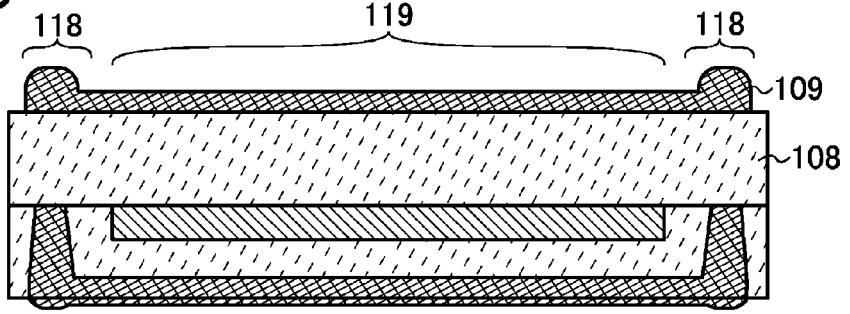

Then, the element formation layer 103 and the first organic resin layer 104 are separated from the substrate 101 by using the separation layer 102 (see FIG. 7C). After the second organic resin layer 108 is formed on the separation surface 115 side, the paste 109 is formed over the second organic resin layer 108 such that the amount of the paste 109 per unit area which is formed in the region 119 overlapping with the element formation layer 103 is made smaller than the amount of the paste 109 per unit area which is formed in the region 118 not overlapping with the element formation layer 103 (see FIG. 7D).

Figure 7E:
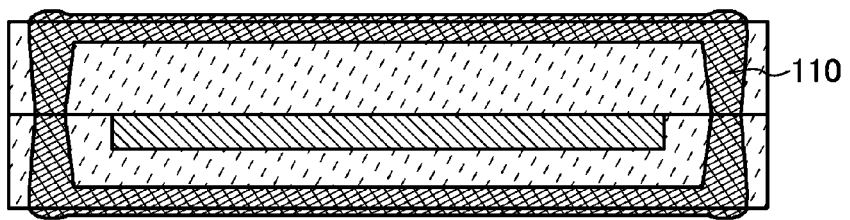

As a result, in the region 118 not overlapping with the element formation layer 103, the second conductor 110 reaches the second surface of the second organic resin layer 108 from the first surface thereof to be electrically connected to the first conductor 106, and, in the region 119 overlapping with the element formation layer 103, the second conductor 110 is provided on the surface (the first surface) side of the second organic resin layer 108 (see FIG. 7E).

As shown in FIGS. 7A to 7E, by controlling the amount of paste in accordance with a region where the paste is formed, the position of the paste which is made to penetrate into an organic resin layer can be controlled.

Note that this embodiment can be implemented by being combined with the structure or the manufacturing method which are described in any of other embodiments in this specification, as appropriate.

Embodiment 4

In this embodiment, a method for manufacturing a plurality of semiconductor devices (semiconductor integrated circuit chips) (here, 4 chips in length×3 chips in width) out of one substrate by providing a plurality of element formation layers each having a semiconductor integrated circuit and an antenna over the same substrate is described with reference to drawings. In the following description, FIGS. 8A to 8C and FIGS. 9A to 9C are schematic top views and FIGS. 10A to 10D, FIGS. 11A to 11C, FIGS. 12A and 12B, FIGS. 13A and 13B, FIGS. 14A and 14B, and FIGS. 15A and 15B are schematic cross-sectional views along line A-B in FIGS. 8A to 8C and FIGS. 9A to 9C.

Figure 8A:
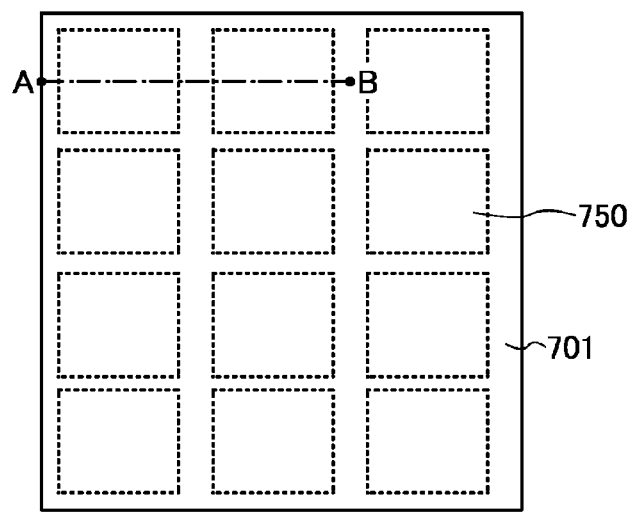
FIGS. 8A to 8C are diagrams illustrating an example of a method for manufacturing a semiconductor device.
Figure 8B:
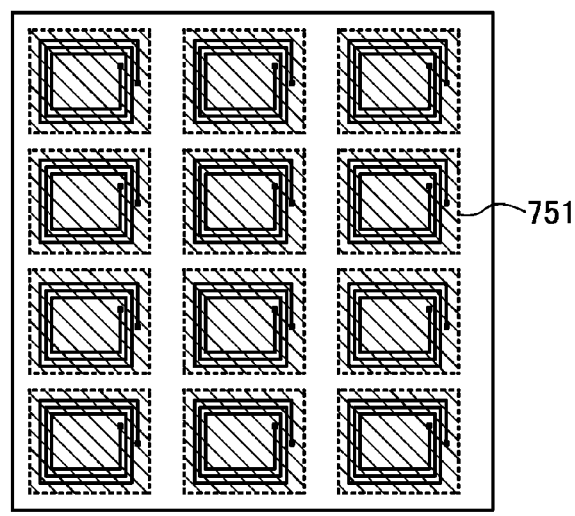

First, a separation layer 702 is formed over one surface of a substrate 701, and then an insulating film 703 to be a base and an amorphous semiconductor film 704 (for example, a film containing amorphous silicon) are formed (see FIG. 8A and FIG. 10A). Note that the separation layer 702, the insulating film 703, and the amorphous semiconductor film 704 may be formed successively. By forming successively, they are not exposed to the air, so that impurities can be prevented from being contained therein. Note that in the following process, an element formation layer including a semiconductor integrated circuit portion and an antenna is formed in each of a plurality of dotted regions 750 shown in FIG. 8A.

As the substrate 701, a glass substrate, a quartz substrate, a metal substrate, a stainless steel substrate, a plastic substrate having heat resistance against the treatment temperature of this step, or the like may be used. When such a substrate is used, area and shape thereof are not restricted so much; therefore, by using a rectangular substrate with at least one meter on a side, for example, the productivity can be drastically improved. This is a major advantage as compared to the case of using a circular silicon substrate. Therefore, even in a case of forming the semiconductor integrated circuit portion larger, the cost can be low as compared to the case of using a silicon substrate.

Note that while the separation layer 702 is formed over an entire surface of the substrate 701 in this step, the separation layer 702 may be selectively formed as necessary by a photolithography method after a separation layer is formed over an entire surface of the substrate 701. Further, while the separation layer 702 is formed so as to be in contact with the substrate 701, it is also allowed that an insulating film such as a silicon oxide film, a silicon oxynitride film, a silicon nitride film, or a silicon nitride oxide film is formed so as to be in contact with the substrate 701 and the separation layer 702 is formed so as to be in contact with the insulating film, as necessary.

As the separation layer 702, a metal film, a stacked layer structure of a metal film and a metal oxide film, or the like may be used. As the metal film, a single layer or stacked layers of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir) or an alloy material or a chemical compound material mainly containing any of the elements can be used. The layer can be formed using these materials by a sputtering method, various CVD methods such as a plasma CVD method, or the like. As the stacked layer structure of a metal film and a metal oxide film, after the above-described metal film is formed, an oxide or oxynitride of the metal film can be formed on the metal film surface by performing a plasma treatment in an oxygen atmosphere or an $N_2O$ atmosphere, or a heat treatment in an oxygen atmosphere or an $N_2O$ atmosphere. Alternatively, the surface of the metal film may be processed with a strong oxidative solution such as ozone water after the above-described metal film is formed, whereby oxide or oxynitride of the metal film can be provided on the metal film.

As the insulating film 703, a single layer or stacked layers of a film containing an oxide of silicon or a nitride of silicon is formed by a sputtering method, a plasma CVD method, or the like. In the case where the insulating film to be a base has a two-layer structure, a silicon nitride oxide film and a silicon oxynitride film may be formed as a first layer and a second layer, respectively, for example. In the case where the insulating layer to be a base has a three-layer structure, a silicon oxide film, a silicon nitride oxide film, and a silicon oxynitride film may be formed as a first-layer insulating layer, a second-layer insulating layer, and a third-layer insulating layer, respectively. Alternatively, a silicon oxynitride film may be formed as a first-layer insulating layer, a silicon nitride oxide film may be formed as a second-layer insulating layer, and a silicon oxynitride film may be formed as a third-layer insulating layer. The insulating film to be a base functions as a blocking film which prevents the entry of an impurity from the substrate 701.

The semiconductor film 704 is formed to a thickness of 25 to 200 nm (preferably 30 to 150 nm) by a sputtering method, an LPCVD method, a plasma CVD method, or the like. As the semiconductor film 704, an amorphous silicon film may be formed, for example.

Next, the semiconductor film 704 is crystallized by laser beam irradiation. Note that the semiconductor film 704 may be crystallized by a method in which laser beam irradiation is combined with a thermal crystallization method using an RTA or an annealing furnace, a thermal crystallization method using a metal element for promoting crystallization, or the like. After that, the crystalline semiconductor film obtained is etched to have a desired shape, so that crystalline semiconductor films 704a to 704d are formed. Then, a gate insulating film 705 is formed so as to cover the semiconductor films 704a to 704d (see FIG. 10B).

An example of a manufacturing step of the crystalline semiconductor films 704a to 704d is briefly described below. First, an amorphous semiconductor film (for example, an amorphous silicon film) with a thickness of 50 to 60 nm is formed by a plasma CVD method. After the amorphous semiconductor film is coated with a solution containing nickel that is a metal element for promoting crystallization, the amorphous semiconductor film is subjected to dehydrogenation treatment (at 500° C. for one hour) and thermal crystallization treatment (at 550° C. for four hours), thereby forming a crystalline semiconductor film. After that, the crystalline semiconductor film is irradiated with a laser beam from a laser, and a photolithography method is used, so that the crystalline semiconductor films 704a to 704d are formed. Note that without conducting the thermal crystallization which uses the metal element for promoting crystallization, the amorphous semiconductor film may be crystallized only by laser beam irradiation.

Next, a gate insulating film 705 covering the crystalline semiconductor films 704a to 704d is formed. The gate insulating film 705 is formed using a single layer or stacked layers of a film containing oxide of silicon or nitride of silicon by a CVD method, a sputtering method, or the like. Specifically, a single layer or stacked layers of a silicon oxide film, a silicon oxynitride film, or/and a silicon nitride oxide film is/are used.

Alternatively, the gate insulating film 705 may be formed by performing the above-described plasma treatment on the semiconductor films 704a to 704d to oxidize or nitride the surfaces. For example, the gate insulating film 705 is formed by a plasma treatment with a mixed gas of a rare gas such as He, Ar, Kr, and Xe, and oxygen, nitrogen oxide ($NO_2$), ammonia, nitrogen, hydrogen, and the like. In that case, if plasma is excited by introduction of a microwave, plasma with a low electron temperature and high density can be generated. With oxygen radical (which may include OH radical) or nitrogen radical (which may include NH radical) generated by high density plasma, oxidizing or nitriding of the surface of the semiconductor film can be conducted.

By a treatment using such high-density plasma, an insulating film with a thickness of 1 to 20 nm, typically 5 to 10 nm, is formed over a semiconductor film. A reaction in this case is a solid-state reaction; therefore, an interface state density between the insulating film and a semiconductor film can be remarkably reduced. Since such plasma treatment oxidizes (or nitrides) a semiconductor film (crystalline silicon, or polycrystalline silicon) directly, unevenness of a thickness of the insulating film to be formed can be extremely small, ideally. In addition, oxidization is not strongly conducted to a crystal grain boundary of crystalline silicon; therefore, a very favorable state can be obtained. In other words, by conducting solid phase oxidization to a surface of the semiconductor film by high-density plasma treatment described here, an insulating film with favorable uniformity and low interface state density can be formed without conducting oxidation reaction extraordinarily in a crystal grain boundary.

As the gate insulating film 705, an insulating film formed by the plasma treatment may be used by itself, or an insulating film of silicon oxide, silicon oxynitride, silicon nitride, or the like may be formed thereover by a CVD method using plasma or thermal reaction, so as to make stacked layers. In either case, as for a transistor formed by including the insulating film formed by plasma treatment in the part or entire of the gate insulating film, variation in characteristics can be made small.

Furthermore, a semiconductor film is irradiated with a continuous wave laser beam or a laser beam oscillated at a repetition rate of equal to or higher than 10 MHz and is scanned in one direction for crystallization, so that each of the semiconductor films 704a to 704d which has a characteristic that the crystal grows in the scanning direction of the laser beam is obtained. When a transistor is placed so that the scanning direction is aligned with the channel length direction (the direction in which carriers flow when a channel forming region is formed) and the above-described gate insulating layer is used, a thin film transistor (TFT) with fewer variation in characteristics and high electron field-effect mobility can be obtained.

Subsequently, conductive films are stacked on the gate insulating film 705. Here, the conductive films formed to a thickness of 100 to 400 nm are stacked over conductive films formed to a thickness of 20 to 100 nm by a plasma CVD method, a sputtering method or the like. The conductive film used is formed using an element selected from tantalum (Ta), tungsten (W), titanium (Ti), molybdenum (Mo), aluminum (Al), copper (Cu), chromium (Cr), niobium (Nb), and the like, or an alloy material or a chemical compound material containing any of the above elements as its main component. Alternatively, the conductive films may be formed using a semiconductor material doped with an impurity element such as phosphorus, typically such as polycrystalline silicon. As an example of a combination of the conductive films to be stacked, a tantalum nitride film and a tungsten film, a tungsten nitride film and a tungsten film, a molybdenum nitride film and a molybdenum film, and the like can be given. Since tungsten and tantalum nitride have high thermal resistance, heat treatment for thermal activation can be performed after the conductive film is formed. If a three-layer structure is adopted instead of the two-layer structure, a molybdenum film, an aluminum film, and a molybdenum film may be stacked.

Next, a resist mask is formed by a photolithography method, and etching treatment for forming a gate electrode and a gate wiring is performed, so that gate electrodes 707 are formed over the semiconductor films 704a to 704d.

Next, a resist mask is formed by a photolithography method, and an impurity element giving n-type conductivity is added at a low concentration to the crystalline semiconductor films 704a to 704d, by an ion doping method or an ion implantation method. As the impurity element imparting n-type conductivity, an element belonging to Group 15, such as phosphorus (P) or arsenic (As), can be used.

Next, an insulating film is formed so as to cover the gate insulating film 705 and the gate electrodes 707. The insulating film is formed as a single layer or stacked layers of a film containing an inorganic material such as silicon, an oxide of silicon, or a nitride of silicon, or an organic material such as an organic resin, by a plasma CVD method, a sputtering method, or the like. Next, the insulating film is selectively etched by anisotropic etching mainly in a vertical direction, so that insulating films 708 (also referred to as side walls) which are in contact with the side surfaces of the gate electrodes 707 are formed. The insulating films 708 are used as masks for doping when LDD (lightly doped drain) regions are formed later.

Next, a resist mask formed by a photolithography method, the gate electrodes 707, and the insulating films 708 are used as masks to add an impurity element imparting n-type conductivity to the crystalline semiconductor films 704a to 704d, so that channel formation regions 706a, first impurity regions 706b, and second impurity regions 706c are formed (see FIG. 10C). The first impurity regions 706b function as source and drain regions of the thin film transistor, and the second impurity regions 706c function as LDD regions. The concentration of impurity elements contained in the second impurity regions 706c is lower than that of impurity elements contained in the first impurity regions 706b.

Next, an insulating film is formed as a single layer or stacked layers so as to cover the gate electrodes 707, the insulating films 708, and the like, so that conductive films 731 which function as source and drain electrodes of the thin film transistor are formed over the insulating film (see FIG. 10D). Note that an element such as the thin film transistor may be provided on an entire surface of the region 750 or over a portion of the region 750 excluding a part (such as a central portion) as described in the above embodiment.

The insulating film is formed as a single layer or stacked layers using an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method, a droplet discharging method, a screen printing method, or the like. Here, the insulating film is formed to have a two-layer structure. A silicon nitride oxide film is formed as a first insulating film 709, and a silicon oxynitride film is formed as a second insulating film 710.

Note that before the insulating films 709 and 710 are formed or after one or more of the insulating films 709 and 710 are formed, heat treatment for recovering the crystallinity of the semiconductor film 704, for activating the impurity element which has been added to the semiconductor film, or for hydrogenating the semiconductor film is preferably performed. For the heat treatment, thermal annealing, a laser annealing method, an RTA method, or the like may be adopted.

The conductive films 731 are formed in the following manner. The insulating films 709 and 710, and the like are etched by a photolithography method, and contact holes are formed to expose the first impurity regions 706b. Then, a conductive film is formed so as to fill the contact holes and the conductive film is selectively etched. Note that a silicide may be formed over the surfaces of the semiconductor films 704a to 704d exposed by the contact holes.

The conductive film 731 is formed by a CVD method, a sputtering method, or the like to have a single-layer structure or a stacked-layer structure with the use of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a chemical compound material containing any of the above elements as its main component. The alloy material mainly containing aluminum corresponds, for example, to a material that mainly contains aluminum and contains nickel, or an alloy material that mainly contains aluminum and contains nickel and one or both of carbon and silicon.

Figure 11A:
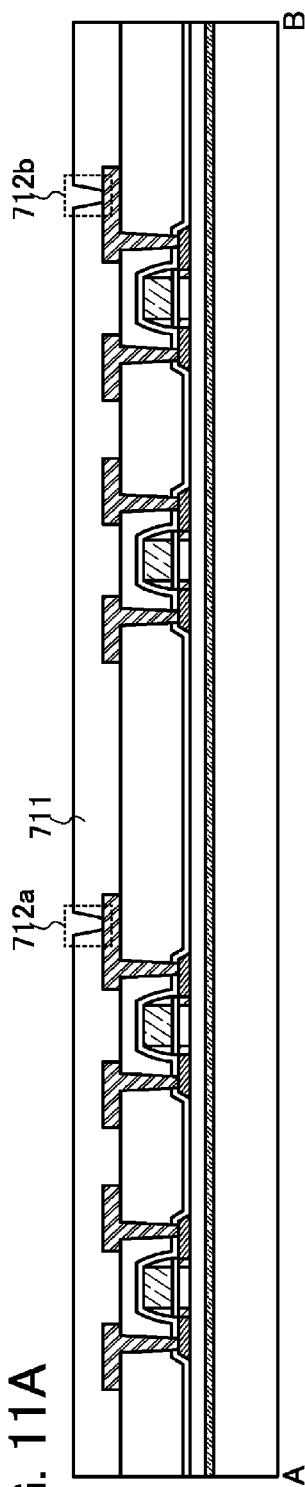
FIGS. 11A to 11C are diagrams illustrating an example of a method for manufacturing a semiconductor device.

Next, an insulating film 711 is formed so as to cover the conductive films 731, and openings 712a and 712b are formed in the insulating film 711 (see FIG. 11A). Here, the openings 712a and 712b are formed so that the conductive films 731 which function as source electrodes or drain electrodes of the thin film transistor 730b and the thin film transistor 730d are exposed. The insulating film 711 is formed as a single layer or stacked layers using an inorganic material or an organic material by a CVD method, a sputtering method, an SOG method, a droplet discharging method, a screen printing method, or the like. The insulating film 711 is preferably formed to a thickness of 0.75 to 3 µm.

Figure 11B:
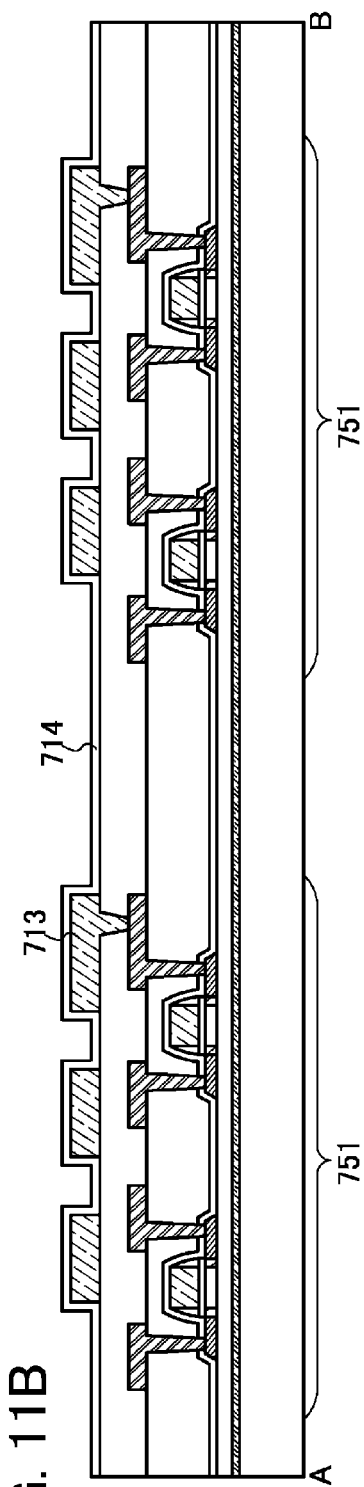

A conductive film 713 which functions as an antenna is formed over the insulating film 711 and an insulating film 714 is formed over the conductive film 713 (see FIG. 11B). As a result, an element formation layer 751 including a thin film transistor and an antenna is obtained (see FIG. 8B). Here, the case where an antenna is directly formed over a semiconductor integrated circuit (on-chip antenna) is described.

As the conductive film 713, a single layer or stacked layers of an element selected from silver (Ag), gold (Au), copper (Cu), nickel (Ni), platinum (Pt), palladium (Pd), tantalum (Ta), molybdenum (Mo), titanium (Ti), or the like or an alloy material or a chemical compound material mainly containing any of the elements is formed by a sputtering method, a plasma CVD method, a coating method, a printing method, or the like.

The shape of the conductive film 713 may be selected as appropriate to suit the transmission method. Here, the conductive film 713 has a coil shape and an electromagnetic coupling method or an electromagnetic induction method (for example, the 13.56 MHz band) is applied. However, the present invention is not limited thereto.

The insulating film 714 can be formed using silicon oxide, silicon oxynitride, silicon nitride, silicon nitride oxide, or the like.

Figure 8C:
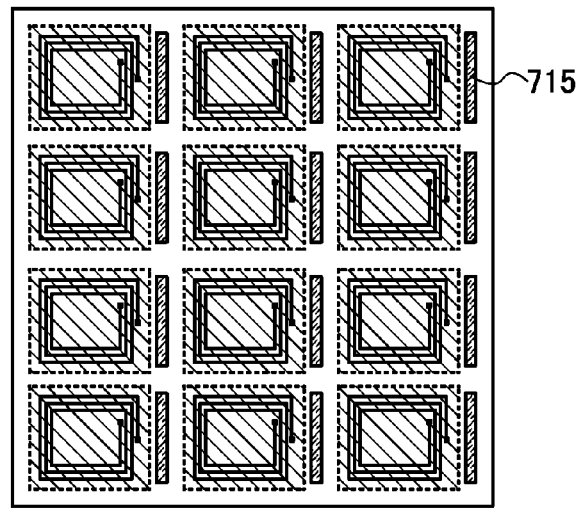
Figure 11C:
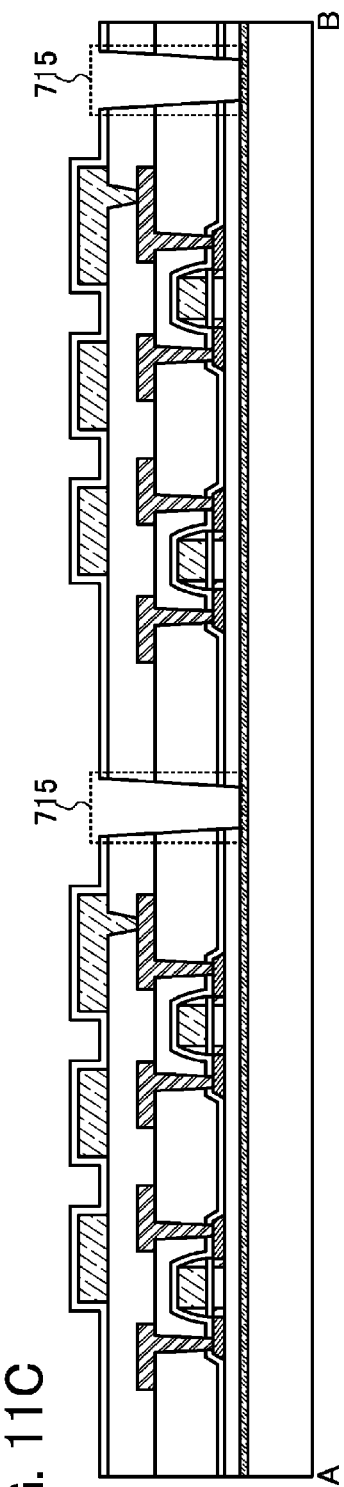

Next, the insulating films 703, 709, 711, and 714 are selectively removed, whereby openings 715 are formed, so that the separation layer 702 and the substrate 701 are exposed (see FIG. 8C and FIG. 11C). The openings 715 are formed so as to avoid the semiconductor integrated circuit and the antenna.

Next, a first structure body 721 is formed so as to cover the insulating film 714 (see FIG. 12A).

For the first structure body 721, a structure in which a fibrous body 721a is impregnated with an organic resin 721b can be employed.

A thermosetting resin such as an epoxy resin, an unsaturated polyester resin, a polyimide resin, a bismaleimide-triazine resin, or a cyanate resin can be used for the organic resin 721b. Further, the organic resin 721b may be formed using a thermoplastic resin such as a polyphenylene oxide resin, a polyetherimide resin, or a fluorine resin.

In FIG. 12A, the openings 715 are filled with the organic resin 721b.

Next, before the organic resin 721b is cured, paste with conductivity is selectively formed over a surface (a first surface) of the first structure body 721 and at least part of the paste is made to penetrate into the organic resin 721*b*. Then, the organic resin 721*b* is cured (see FIG. 9A and FIG. 12B). As a result, a first conductor 722 can be provided in the first structure body 721.

Here, over the first surface of the first structure body 721, the paste is selectively formed in a region overlapping with the openings 715, and the paste is made to penetrate into the organic resin 721*b* provided in the openings 715.

As a material or a manufacturing method of the paste, any of the materials or manufacturing methods of the paste 105 which are exemplified in Embodiment 1 can be used.

Further, after the paste is made to penetrate into the organic resin 721*b*, the paste is preferably cured by performing baking at the same time as curing of the organic resin 721*b*, before curing of the organic resin 721*b*, or after curing of the organic resin 721*b*. Note that in the case where a thermosetting resin such as an epoxy resin is used as the organic resin 721*b*, heat treatment is performed after the paste is made to penetrate, whereby the organic resin 721*b* can be cured and a conductor included in the paste can be cured. In the case where a thermosetting resin is used as the organic resin 721*b*, curing of the organic resin 721*b* and baking of the paste can be concurrently performed; therefore, a process can be simplified.

Figure 9A:
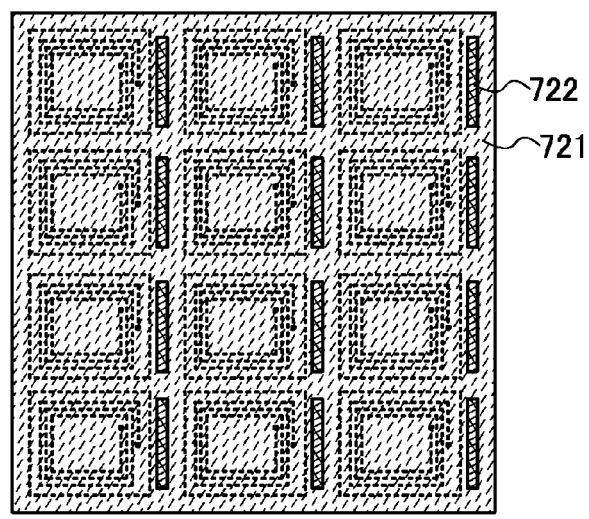
FIGS. 9A to 9C are diagrams illustrating an example of a method for manufacturing a semiconductor device.
Figure 9B:
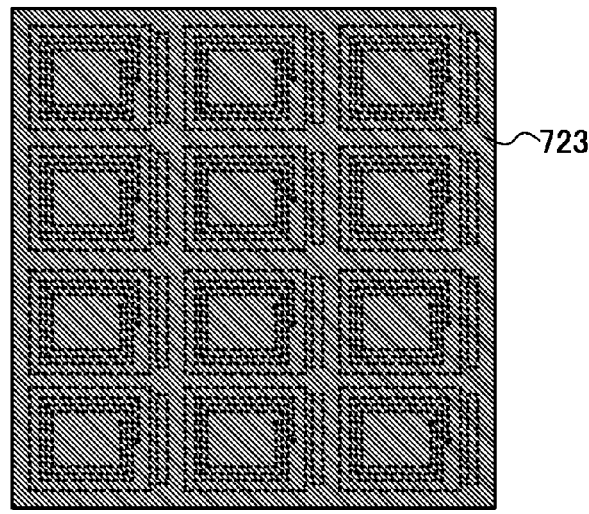
Figure 13A:
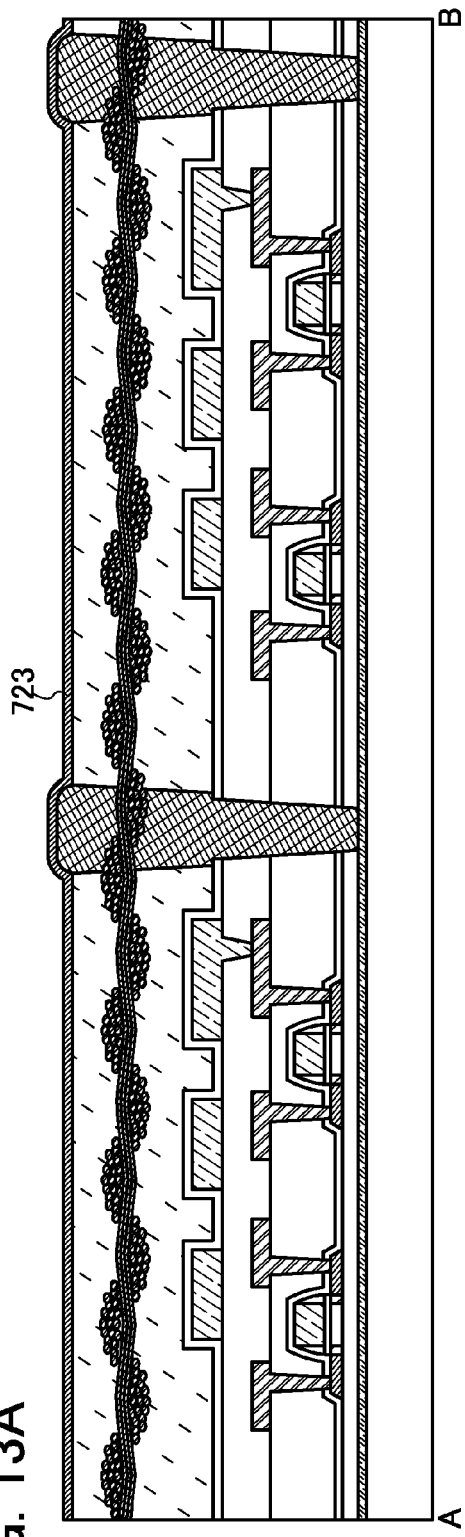
FIGS. 13A and 13B are diagrams illustrating an example of a method for manufacturing a semiconductor device.

Next, over the first surface of the first structure body 721, a first conductive film 723 is formed (see FIG. 9B and FIG. 13A). The first conductive film 723 is provided so as to be electrically connected to the first conductor 722.

As a material or a manufacturing method of the first conductive film 723, any of the materials or manufacturing methods of the first conductive film 107 which are exemplified in Embodiment 1 can be used.

By providing the first conductive film 723, static electricity applied by electrostatic discharge can be diffused and removed or electric charges can be prevented from locally existing (from being localized). Therefore, an electrostatic breakdown of a semiconductor integrated circuit can be prevented.

Therefore, the first conductive film 723 may be provided at least in a region overlapping with the semiconductor integrated circuit. For example, as shown in FIG. 13A, a structure can be employed in which the first conductive film 723 is provided over an entire surface of the first structure body 721. In the case where the first conductive film 723 is provided over the entire surface, a large region can be protected from static electricity.

The semiconductor device described in this embodiment is operated by induced electromotive force generated by an electromagnetic wave from outside (the semiconductor device has a function of wireless transmission). Therefore, the first conductive film 723 needs to prevent a breakdown of the semiconductor integrated circuit which is caused by static electricity and to be formed using a conductive material which transmits an electromagnetic wave.

In this embodiment, the thickness of the first conductive film 723 is made small enough to transmit an electromagnetic wave. The thickness of the first conductive film 723 may be set on the basis of the frequency of an electromagnetic wave used for communication, or the resistivity or magnetic permeability of a conductive material used for the first conductive film 723.

For example, the first conductive film 723 is formed using titanium to a thickness of 5 nm to 100 nm, preferably 10 nm to 30 nm.

Figure 13B:
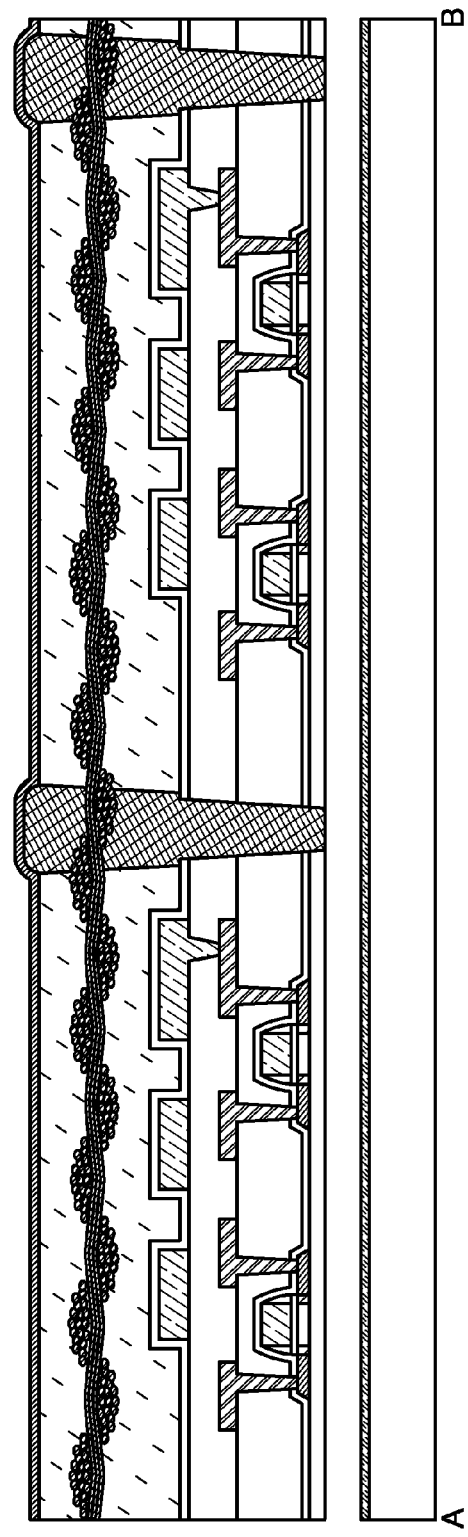

Next, the element formation layer 751 including the thin film transistors 730*a* to 730*d* and the conductive film 713 which functions as an antenna, and the like is separated from the substrate 701 (see FIG. 13B).

Note that separation is performed with a surface to be separated getting wet with water or a solution such as ozone water, so that elements such as the thin film transistors 730*a* to 730*d* can be prevented from being broken by static electricity or the like. Further, by reusing of the substrate 701 from which the element formation layer is separated, the cost can be reduced.

Next, a second structure body 725 is formed so as to cover a surface exposed by separation (a surface of the insulating film 703) (see FIG. 14A).

As the second structure body 725, a structure can be employed in which a fibrous body 725*a* is impregnated with an organic resin 725*b*.

A thermosetting resin such as an epoxy resin, an unsaturated polyester resin, a polyimide resin, a bismaleimide-triazine resin, or a cyanate resin can be used for the organic resin 725*b*. Alternatively, as the organic resin 725*b*, a thermoplastic resin such as a polyphenylene oxide resin, a polyetherimide resin, or a fluorine resin can be used.

Next, before the organic resin 725*b* is cured, paste with conductivity is selectively formed over a surface (a first surface) of the second structure body 725 and at least part of the paste is made to penetrate into the organic resin 725*b*. Then, the organic resin 725*b* is cured (see FIG. 14B). As a result, the second conductor 726 can be provided in the organic resin 725*b*.

The paste is formed in a region overlapping with the first conductor 722 exposed on the separation surface, and is made to penetrate to a second surface of the second structure body 725 (a surface in contact with the surface exposed by separation (the surface of the insulating film 703)). Therefore, the second conductor 726 reaches the second surface of the second structure body 725 from the first surface thereof, and is electrically connected to the first conductor 722.

Next, the second conductive film 727 is formed over the first surface of the second structure body 725 (see FIG. 15A). The second conductive film 727 is provided so as to be electrically connected to the second conductor 726. As a result, the first conductive film 723 and the second conductive film 727 are electrically connected to each other through the first conductor 722 and the second conductor 726.

By providing the second conductive film 727, static electricity applied by electrostatic discharge can be diffused and removed or electric charges can be prevented from locally existing (from being localized). Therefore, an electrostatic breakdown of a semiconductor integrated circuit can be prevented.

Therefore, the second conductive film 727 may be provided at least in a region overlapping with the semiconductor integrated circuit. For example, as shown in FIG. 15A, a structure can be employed in which the second conductive film 727 is provided over an entire surface of the second structure body 725. In the case where the second conductive film 727 is provided over the entire surface, a large region can be protected from static electricity.

In particular, the first conductive film 723 provided over the first structure body 721 and the second conductive film 727 provided over the second structure body 725 are electrically connected to each other to be equipotential, whereby static electricity can be effectively diffused and electric charges can be effectively prevented from being localized as compared to the case where the first conductive film 723 and the second conductive film 727 are provided so as not to be electrically connected to each other or the case where only one of the first structure body 721 and the second structure body 725 is provided with a conductive film. As a result, a breakdown of a semiconductor integrated circuit can be effectively prevented.

Further, the thickness of the second conductive film 727 is also made small enough to transmit an electromagnetic wave as with the first conductive film 723.

Figure 9C:
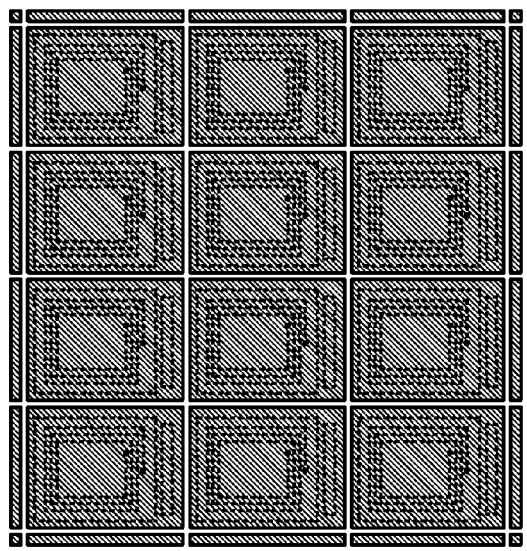

Next, a plurality of semiconductor integrated circuits and a plurality of antennas which are interposed between the first structure body 721 provided with the first conductive film 723 and the second structure body 725 provided with the second conductive film 727 are selectively divided by dicing, scribing, a laser cutting method, or the like, whereby a plurality of semiconductor devices can be obtained (see FIG. 9C and FIG. 15B).

Note that although the case where the openings 715 are provided before the first structure body 721 is formed is described above, the present invention is not limited thereto. For example, a formation method as shown in FIGS. 16A and 16B, FIGS. 17A and 17B, and FIGS. 18A and 18B may be employed.

First, after steps up to formation of components shown in FIG. 11B are performed, the first structure body 721 is formed over the insulating film 714 (see FIG. 16A), and paste is made to penetrate into the organic resin 721b to form the first conductor 722 (see FIG. 16B). Subsequently, after the first conductive film 723 is formed over the first structure body 721 so as to be electrically connected to the first conductor 722, an element formation layer including the thin film transistors 730a to 730d, the conductive film 713 functioning as an antenna, and the like is separated from the substrate 701 (see FIG. 17A).

Next, laser beam irradiation is selectively performed from the separation surface side to expose the first conductor 722 (see FIG. 17B).

Next, the second structure body 725 is formed so as to cover a surface exposed by separation (a surface of the insulating film 703) (see FIG. 18A). Paste is made to penetrate into the organic resin 725b to form the second conductor 726, and the second conductive film 727 is formed over the second structure body 725 so as to be electrically connected to the second conductor 726 (see FIG. 18B).

Next, a plurality of semiconductor integrated circuits and a plurality of antennas which are interposed between the first structure body 721 provided with the first conductive film 723 and the second structure body 725 provided with the second conductive film 727 are selectively divided by dicing, scribing, a laser cutting method, or the like, whereby a plurality of semiconductor devices can be obtained.

The method for manufacturing a semiconductor device which is described in this embodiment can be applied to manufacture of the semiconductor device described in any of the other embodiments in this specification.

Embodiment 5

In this embodiment, an application example of a semiconductor device in which data can be input and output without contact and which is formed using any of the above embodiments, is described with reference to drawings. The semiconductor device which can input and output data without contact is also referred to as an RFID tag, an ID tag, an IC tag, an IC chip, an RF tag, a wireless tag, an electronic tag, or a wireless chip depending on application modes.

Figure 19A:
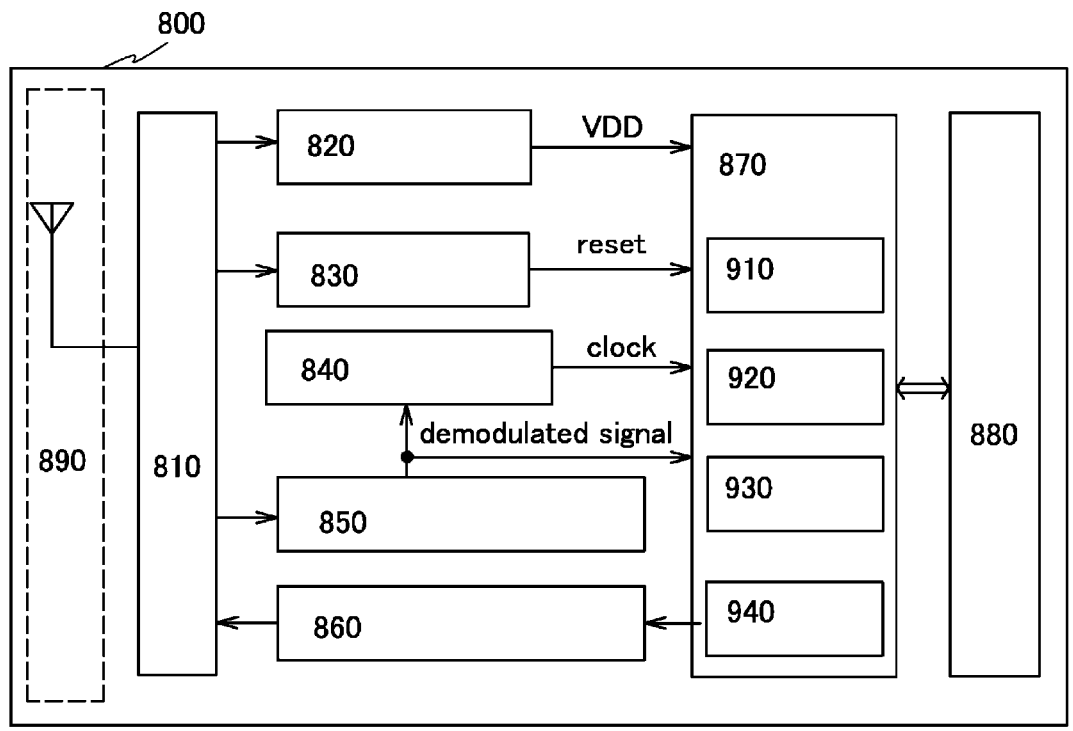
FIGS. 19A to 19C are diagrams illustrating usage patterns of a semiconductor device.

A semiconductor device 800 has a function of communicating data without contact, and includes a high-frequency circuit 810, a power supply circuit 820, a reset circuit 830, a clock generating circuit 840, a data demodulating circuit 850, a data modulating circuit 860, a control circuit 870 which controls another circuit, a memory circuit 880, and an antenna 890 (see FIG. 19A). The high-frequency circuit 810 receives a signal from the antenna 890 and outputs a signal, which is received from the data modulating circuit 860, with the antenna 890. The power source circuit 820 generates power source potential from a received signal. The reset circuit 830 generates a reset signal. The clock generating circuit 840 generates various clock signals based on a received signal input from the antenna 890. The data demodulating circuit 850 demodulates a received signal and outputs the demodulated signal to the controlling circuit 870. The data modulating circuit 860 modulates a signal received from the controlling circuit 870. As the controlling circuit 870, for example, a code extracting circuit 910, a code judging circuit 920, a CRC judging circuit 930, and an output unit circuit 940 are provided. It is to be noted that the code extracting circuit 910 extracts each of a plurality of codes included in an instruction sent to the controlling circuit 870. The code judging circuit 920 judges the content of the instruction by comparing the extracted code with a code corresponding to a reference. The CRC judging circuit 930 detects whether or not there is a transmission error or the like based on the judged code.

Next, an example of operation of the above-described semiconductor device will be described. First, a wireless signal is received by the antenna 890. The wireless signal is transmitted to the power supply circuit 820 via the high frequency circuit 810, and a high power supply potential (hereinafter referred to as VDD) is generated. The VDD is supplied to each circuit in the semiconductor device 800. A signal sent to the data demodulating circuit 850 through the high-frequency circuit 810 is demodulated (hereinafter, this signal is referred to as a demodulated signal). Moreover, signals passed through the reset circuit 830 and the clock generating circuit 840 through the high-frequency circuit 810, and the demodulated signal are sent to the controlling circuit 870. The signals sent to the controlling circuit 870 are analyzed by the code extracting circuit 910, the code judging circuit 920, the CRC judging circuit 930, and the like. Then, based on the analyzed signals, information of the semiconductor device stored in the memory circuit 880 is output. The output information of the semiconductor device is encoded through the output unit circuit 940. Further, the encoded information of the semiconductor device 800 passes through the data modulating circuit 860 and then is sent by the antenna 890 as a wireless signal. It is to be noted that low power source potential (hereinafter referred to as VSS) is common in the plurality of circuits included in the semiconductor device 800 and VSS can be GND.

In this manner, data in the semiconductor device 800 can be read by transmitting a signal to the semiconductor device 800 from a communication device and by receiving a signal which is transmitted from the semiconductor device 800 by the communication device.

Moreover, in the semiconductor device 800, power source voltage may be supplied to each circuit by electromagnetic waves without mounting a power source (battery), or a power source (battery) may be mounted so that power source voltage is supplied to each circuit by both electromagnetic waves and the power source (battery).

Figure 19B:
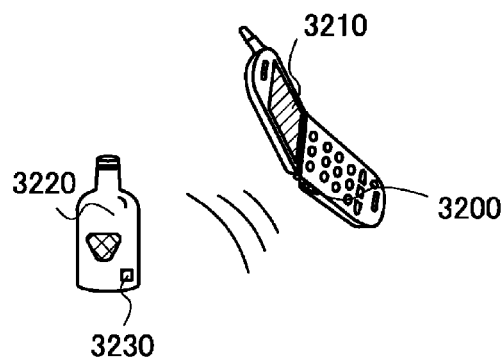
Figure 19C:
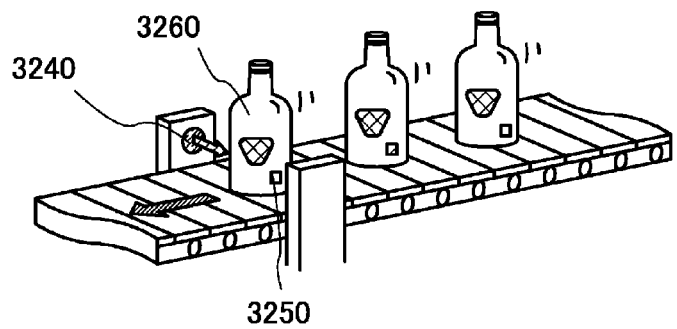
Figure 20A:
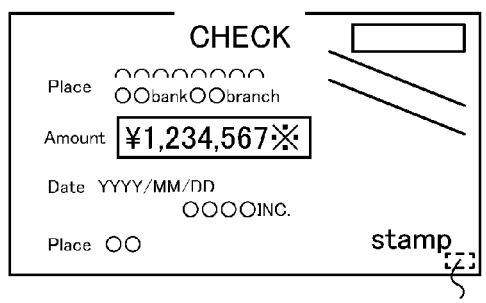
FIGS. 20A to 20G are diagrams illustrating usage patterns of a semiconductor device.
Figure 20B:
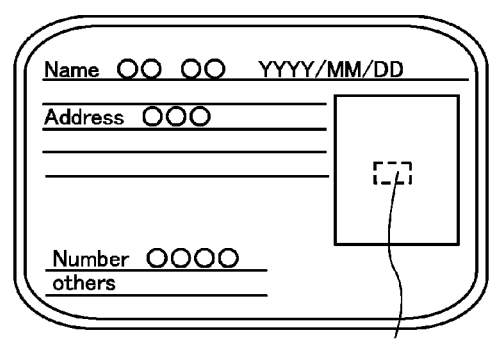
Figure 20C:
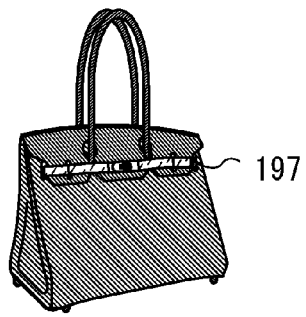
Figure 20D:
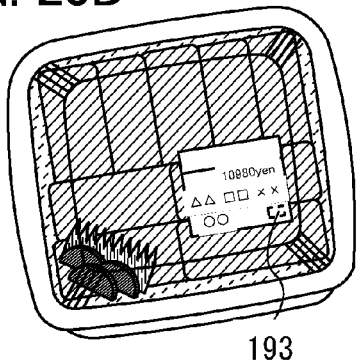
Figure 20E:
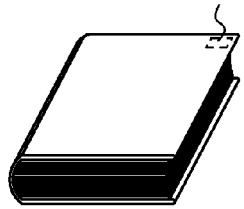
Figure 20F:
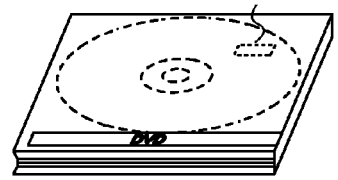
Figure 20G:
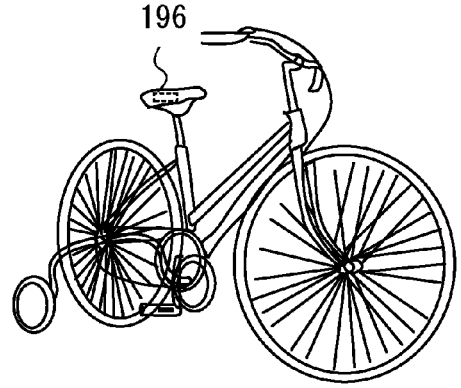

Next, an example of usage patterns of a semiconductor device in which data can be inputted/outputted without contact is explained. A side surface of a mobile terminal which includes a display portion 3210 is provided with a communication device 3200. A side surface of a product 3220 is provided with a semiconductor device 3230 (see FIG. 19B). When the communication device 3200 is held up to the semiconductor device 3230 included in the product 3220, the display portion 3210 displays information about the product, such as its materials, its place of production, inspection results for each production step, a history of the distribution process, and a description of the product. Further, while a product 3260 is transported by a conveyor belt, the product 3260 can be inspected using a communication device 3240 and a semiconductor device 3250 provided on the product 3260 (see FIG. 19C). In this manner, information can be easily obtained, and high functions and high added values are realized by utilizing a semiconductor device for a system.

As described above, a semiconductor device described in any of the above embodiments has a very wide range of application, and can be used in electronic devices in all kinds of fields.

Embodiment 6

A semiconductor device described in any of the above embodiments can be used as a chip having a processor circuit (hereinafter also called a processor chip, a wireless chip, a wireless processor, a wireless memory, or a wireless tag). Note that an applicable range of the semiconductor device described in any of the above embodiments is wide, and the semiconductor device can be applied to any product that clarifies information of an object, such as the history thereof, without contact and is useful for production, management, or the like. For example, the semiconductor device may be incorporated in bills, coins, securities, certificates, bearer bonds, packing containers, books, recording media, personal belongings, vehicles, groceries, clothes, healthcare items, commodities, medicals, and electronic devices. Examples of these objects are described with reference to FIGS. 20A to 20G.

The bills and coins are money that circulates in the market, and includes one that can be used in the same way as money in a specific area (cash voucher), a commemorative coin, and the like. Securities refer to checks, certificates, promissory notes, and the like, and can be provided with a chip 190 having a processor circuit (see FIG. 20A). The certificates refer to driver's licenses, certificates of residence, and the like, and can be provided with a chip 191 including a processor circuit (see FIG. 20B). The personal belongings refer to bags, glasses, and the like, and can be provided with a chip 197 including a processor circuit (see FIG. 20C). Bearer bonds refer to stamps, rice coupons, various merchandise coupons, and the like. Packing containers refer to wrapping paper for box lunches and the like, plastic bottles, and the like, and can be provided with a chip 193 having a processor circuit (see FIG. 20D). Books refer to hardbacks, paperbacks, and the like, and can be provided with a chip 194 having a processor circuit (see FIG. 20E). The recording media refer to DVD software, video tapes, and the like, and can be provided with a chip 195 having a processor circuit (see FIG. 20F). The vehicles refer to wheeled vehicles such as bicycles, ships, and the like, and can be provided with a chip 196 having a processor circuit (see FIG. 20G). The groceries refer to foods, beverages, and the like. The clothes refer to clothing, shoes, and the like. The healthcare items refer to a medical apparatus, a health appliance, and the like. The commodities refer to furniture, lighting apparatus, and the like. The medicines refer to a drug, an agricultural chemical, and the like. The electronic devices refer to a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the packing containers, the recording media, the personal belonging, the groceries, the clothes, the commodities, the electronic devices, or the like with the semiconductor device. In addition, by providing the vehicles with the semiconductor device, forgery or theft can be prevented. In addition, when the semiconductor device is implanted into creatures such as animals, each creature can be identified easily. For example, by enveloping/attaching the semiconductor device with a sensor in/to a creature such as livestock, its health condition such as a current body temperature as well as its birth year, sex, breed, or the like can be easily managed.

EXAMPLE 1

In this example, the case is described where a conductor is provided in a structure body in which a fibrous body is impregnated with an organic resin by making paste with conductivity penetrate.

First, two prepregs were prepared. As the prepreg, an object having a structure in which a glass fibrous body is impregnated with a brominated epoxy resin was used.

Next, the two prepregs were stacked, and then, silver paste was formed using a screen printing method over a surface of the prepreg and the silver paste was made to penetrate into the prepregs before the brominated epoxy resins included in the prepregs were cured. As the silver paste, an object including silver powder, 2-(2-butoxyethoxy)ethyl acetate, and an epoxy resin was used.

Then, heat treatment was performed at 195° C. for 60 minutes with a pressure of 3 MPa applied, and then, a cross section of the structure body was observed by SEM (scanning electron microscope).

Figure 21:
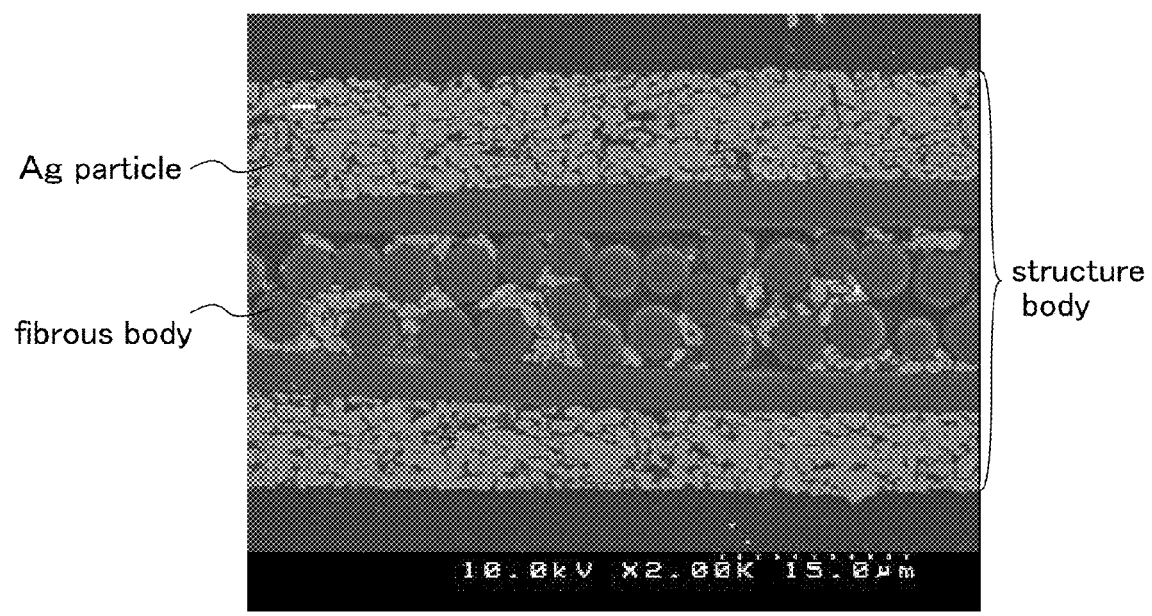
FIG. 21 is a SEM image of a cross section of the case where a conductive film is provided in a structure body in which a fibrous body is impregnated with an organic resin.

FIG. 21 shows the cross section of the structure body observed by SEM.

As shown in FIG. 21, silver was observed from an upper surface to a lower surface of the two structure bodies attached together. In addition, it was confirmed that the fibrous bodies were not broken, and the silver paste penetrated into the brominated epoxy resins through space in the fibrous bodies. That is, it was confirmed that, by making paste penetrate before curing an organic resin and then curing the organic resin, a conductor was able to be provided in the structure bodies without breaking the fibrous bodies.

This application is based on Japanese Patent Application serial no. 2008-149535 filed with Japan Patent Office on Jun. 6, 2008, the entire contents of which are hereby incorporated by reference.

What is claimed is:

1. A method for manufacturing a semiconductor device comprising:
   forming a separation layer over a substrate;
   forming an element formation layer having a semiconductor integrated circuit and an antenna over the separation layer;
   forming an organic resin layer so as to cover the element formation layer;
   forming paste with conductivity over a first surface of the organic resin layer before the organic resin layer is cured, the paste being in a region not overlapping with at least the element formation layer;

forming a conductor which reaches a second surface of the organic resin layer opposite to the first surface of the organic resin layer from the first surface by curing the organic resin layer after the paste is made to penetrate into the organic resin layer; and forming a conductive film over the organic resin layer so as to be electrically connected to the conductor and so as to overlap with the element formation layer.

2. The method for manufacturing a semiconductor device according to claim 1, wherein a structure body in which a fibrous body is impregnated with an organic resin is used instead of the organic resin layer.

3. The method for manufacturing a semiconductor device according to claim 2, wherein an epoxy resin is used as the organic resin, and silver paste is used as the paste.

4. A method for manufacturing a semiconductor device comprising:

forming a separation layer over a substrate;

forming an element formation layer having a semiconductor integrated circuit and an antenna over the separation layer;

forming a first organic resin layer so as to cover the element formation layer;

forming first paste with conductivity over a first surface of the first organic resin layer before the first organic resin layer is cured, the first paste being in a region not overlapping with at least the element formation layer;

forming a first conductor which reaches a second surface of the first organic resin layer opposite to the first surface of the first organic resin layer from the first surface by curing the first organic resin layer after the first paste is made to penetrate into the first organic resin layer;

forming a first conductive film over the first organic resin layer so as to be electrically connected to the first conductor and so as to overlap with the element formation layer;

separating the element formation layer from the substrate to expose the first conductor formed in the first organic resin layer on a separation surface;

forming a second organic resin layer over the separation surface;

forming second paste with conductivity over a first surface of the second organic resin layer before the second organic resin layer is cured, the second paste being in a region overlapping with at least the first conductor exposed on the separation surface;

forming a second conductor which reaches a second surface of the second organic resin layer opposite to the first surface of the second organic resin layer from the first surface and is electrically connected to the first conductor by curing the second organic resin layer after the second paste is made to penetrate into the second organic resin layer; and forming a second conductive film over the second organic resin layer so as to be electrically connected to the second conductor and so as to overlap with the element formation layer.

5. The method for manufacturing a semiconductor device according to claim 4, wherein a structure body in which a fibrous body is impregnated with an organic resin is used instead of at least one of the first organic resin layer and the second organic resin layer.

6. The method for manufacturing a semiconductor device according to claim 5, wherein an epoxy resin is used as the organic resin, and silver paste is used as the first paste and the second paste.

7. A method for manufacturing a semiconductor device comprising:

forming a separation layer over a substrate;

forming a first protective film over the separation layer;

forming an element formation layer having a semiconductor integrated circuit and an antenna over the first protective film;

forming a second protective film over the element formation layer;

forming a first organic resin layer so as to cover the second protective film;

forming first paste with conductivity over a first surface of the first organic resin layer before the first organic resin layer is cured;

forming a first conductor which reaches a second surface of the first organic resin layer opposite to the first surface of the first organic resin layer from the first surface by curing the first organic resin layer after the first paste is made to penetrate into the first organic resin layer;

separating the element formation layer from the substrate and selectively removing the first protective film and the second protective film at a separation surface to expose the first conductor formed in the first organic resin layer;

forming a second organic resin layer over the separation surface;

forming second paste with conductivity over a first surface of the second organic resin layer before the second organic resin layer is cured; and forming a second conductor which reaches a second surface of the second organic resin layer opposite to a first surface of the second organic resin layer from the first surface and is electrically connected to the first conductor by curing the second organic resin layer after the second paste is made to penetrate into the second organic resin layer.

8. The method for manufacturing a semiconductor device according to claim 7, wherein the first paste formed over the first surface of the first organic resin layer is provided in a meshed manner, and the second paste formed over the first surface of the second organic resin layer is provided in a meshed manner.

9. The method for manufacturing a semiconductor device according to claim 7, wherein a structure body in which a fibrous body is impregnated with an organic resin is used instead of at least one of the first organic resin layer and the second organic resin layer.

10. The method for manufacturing a semiconductor device according to claim 9, wherein an epoxy resin is used as the organic resin, and silver paste is used as the first paste and the second paste.

11. A semiconductor device comprising:

a first organic resin layer and a second organic resin layer which are provided so as to face each other;

an element formation layer having a semiconductor integrated circuit and an antenna, which is provided between the first organic resin layer and the second organic resin layer;

a first conductive film provided on a first surface of the first organic resin layer;

a second conductive film provided on a first surface of the second organic resin layer;

a first conductor which is electrically connected to the first conductive film and reaches a second surface of the first organic resin layer opposite to the first surface of the first organic resin layer from the first surface; and a second conductor which is electrically connected to the second conductive film and reaches a second surface of the second organic resin layer opposite to a first surface of the second organic resin layer from the first surface, wherein the first organic resin layer includes at least a structure body in which a fibrous body is impregnated with an organic resin, wherein the first conductor is provided in the first organic resin layer through space in the fibrous body, and wherein the first conductive film and the second conductive film are electrically connected to each other through the first conductor and the second conductor.

12. The semiconductor device according to claim 11, wherein the first conductor and the second conductor are made of silver.

13. A semiconductor device comprising:
a first organic resin layer and a second organic resin layer which are provided so as to face each other;
an element formation layer having a semiconductor integrated circuit and an antenna, which is provided between the first organic resin layer and the second organic resin layer;
a first conductive film provided on a first surface of the first organic resin layer;
a second conductive film provided on a first surface of the second organic resin layer;
a first conductor which is electrically connected to the first conductive film and reaches a second surface of the first organic resin layer opposite to the first surface of the first organic resin layer from the first surface; and
a second conductor which is electrically connected to the second conductive film and reaches a second surface of the second organic resin layer opposite to a first surface of the second organic resin layer from the first surface, wherein the first organic resin layer includes at least a structure body in which a first fibrous body is impregnated with a first organic resin, wherein the first conductor is provided in the first organic resin layer through space in the first fibrous body, wherein the second organic resin layer includes at least a structure body in which a second fibrous body is impregnated with a second organic resin, wherein the second conductor is provided in the second organic resin layer through space in the second fibrous body, and wherein the first conductive film and the second conductive film are electrically connected to each other through the first conductor and the second conductor.

14. The semiconductor device according to claim 13, wherein the first conductor and the second conductor are made of silver.

* * * * *